United States Patent [19]
Blyth et al.

[11] Patent Number: 5,241,494
[45] Date of Patent: Aug. 31, 1993

[54] INTEGRATED CIRCUIT SYSTEM FOR ANALOG SIGNAL RECORDING AND PLAYBACK

[75] Inventors: Trevor Blyth, Milpitas; Sakhawat Khan, Santa Clara; Richard Simko, Los Altos Hills, all of Calif.

[73] Assignee: Information Storage Devices, San Jose, Calif.

[21] Appl. No.: 588,949

[22] Filed: Sep. 26, 1990

[51] Int. Cl.$^5$ .......................... G11C 7/00; G11C 11/40
[52] U.S. Cl. ....................................... 365/45; 365/185; 365/210
[58] Field of Search ................. 365/45, 205, 206, 185, 365/189.01, 201, 210, 230.08; 360/32, 39

[56] References Cited

U.S. PATENT DOCUMENTS

| | | | |
|---|---|---|---|
| 3,938,108 | 2/1976 | Salsbury et al. | 340/173 |
| 3,984,822 | 10/1976 | Simko et al. | 340/173 |
| 4,034,199 | 7/1977 | Lampe et al. | 365/183 |
| 4,054,864 | 10/1977 | Audaire et al. | 340/173 |
| 4,099,196 | 7/1978 | Simko | 357/23 |
| 4,119,995 | 10/1978 | Simko | 357/23 |
| 4,181,980 | 1/1980 | McCoy | 365/45 |
| 4,209,852 | 6/1980 | Hyatt | 365/45 |
| 4,314,265 | 2/1982 | Simko | 357/23 |
| 4,318,188 | 3/1982 | Hoffmann | 365/45 |
| 4,391,530 | 7/1983 | Wakabayashi et al. | 365/45 |
| 4,533,846 | 8/1985 | Simko | 307/550 |
| 4,538,269 | 8/1985 | Briscoe | 365/230.08 |
| 4,573,142 | 2/1986 | Azegami | 365/45 |
| 4,627,027 | 12/1986 | Rai et al. | 365/45 |
| 4,701,776 | 10/1987 | Perlegos et al. | 357/23.5 |
| 4,809,223 | 2/1989 | Brown | 365/45 |
| 4,811,285 | 3/1989 | Walker et al. | |
| 4,819,212 | 4/1989 | Nakai et al. | 365/210 |
| 4,890,259 | 12/1989 | Simko | 365/45 |
| 4,910,706 | 3/1990 | Hyatt | 365/189.01 |
| 5,022,009 | 6/1991 | Terada et al. | 365/210 |

OTHER PUBLICATIONS

"A 1mV MOS Comparator" by Yen S. Yee, Lewis M. Terman, Lawrence G. Heller, IEEE Journal, Solid State Circuits, vol. SC-13, pp. 294-298, Jun. 1978.

1982 ISSCC Digest of Technical Papers re "A 16K E2PROM" by National Semiconductor Corp., pp. 108-109.

"A 25ns 16K CMOS PROM Using a 4-Transistor Cell" by Patnak et al. (1985 ISSCC Digest of Technical Papers, pp. 162-163).

1989 ISSCC Digest of Technical Papers re "A 5V-Only 256k Bit CMOS Flash EEPROM" by Texas Instruments Inc.

Primary Examiner—Joseph L. Dixon
Assistant Examiner—Jack A. Lane
Attorney, Agent, or Firm—Blakely, Sokoloff, Taylor & Zafman

[57] ABSTRACT

Integrated circuit system for analog signal recording and playback having improved performance and a very high level of integration. The integrated circuit is complete with preamplifier, automatic gain control, filter, fixed references including a band gap reference, trimming, power output amplifier, memory array, multiple closed loop sample and hold circuits, column decoder, column driver, row decoder, address counters, master oscillator and chip function timing circuits including sample clock, charge pumps, high voltage regulator and waveshapers, low VCC detector, power-on reset and recording reference circuits on a single chip. The system uses a writable analog reference scheme to put many error sources in the common mode, and provides a double ended output for maximum power output in a limited voltage range, and to allow direct connection to a speaker. Trim bits are provided for trimming the oscillator and filter so that the filter characteristics match and track the oscillator frequency and provision is made for absolute addressing and digital end of message markers. Programming is by way of a multi level iterative write process for high resolution.

41 Claims, 15 Drawing Sheets

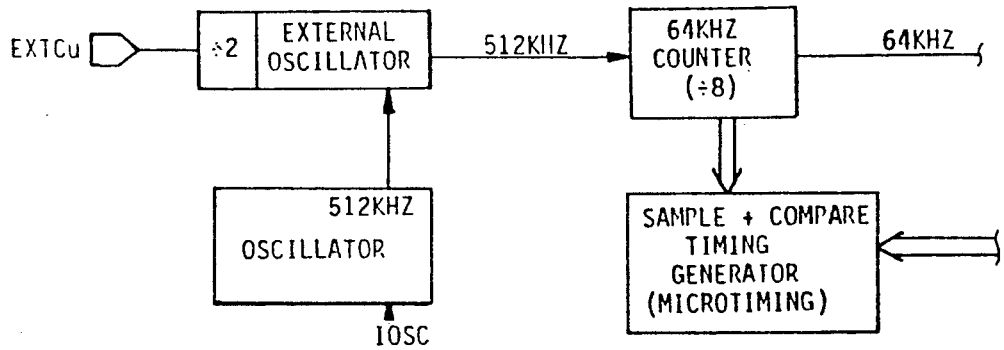
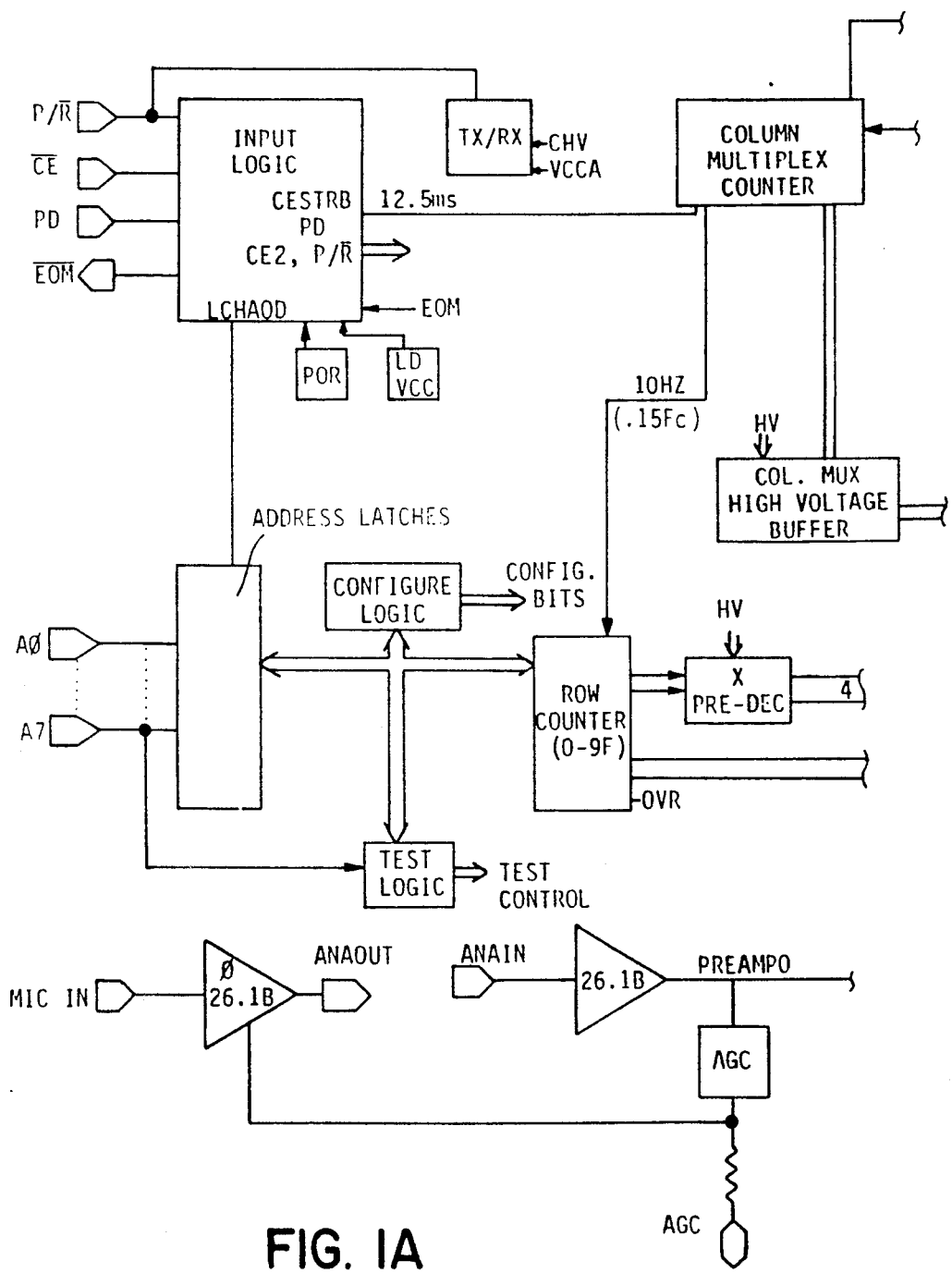
FIG. 1A

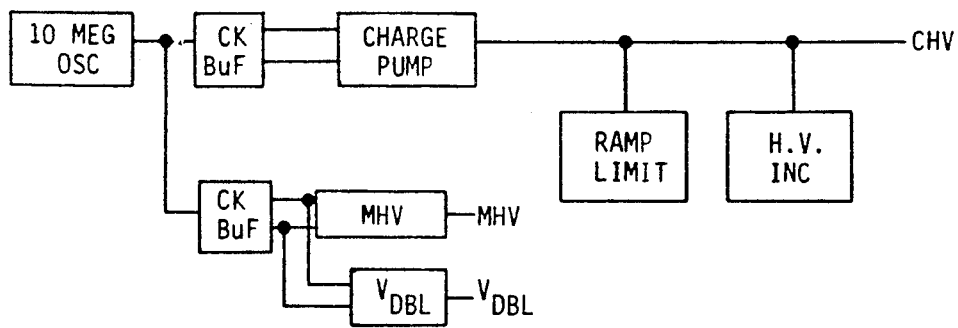
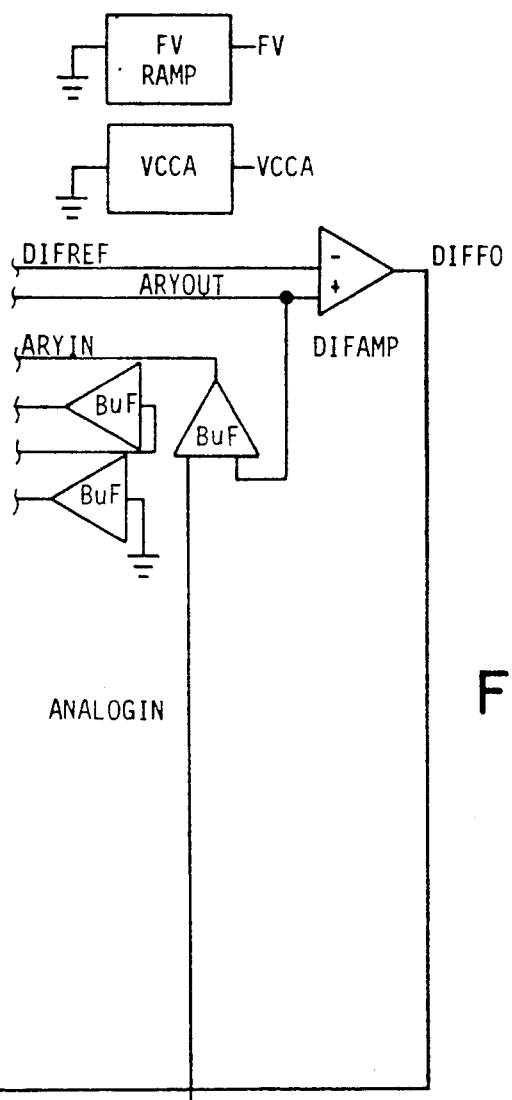
FIG. IC
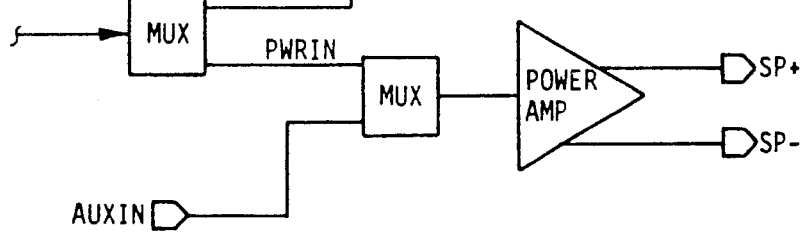

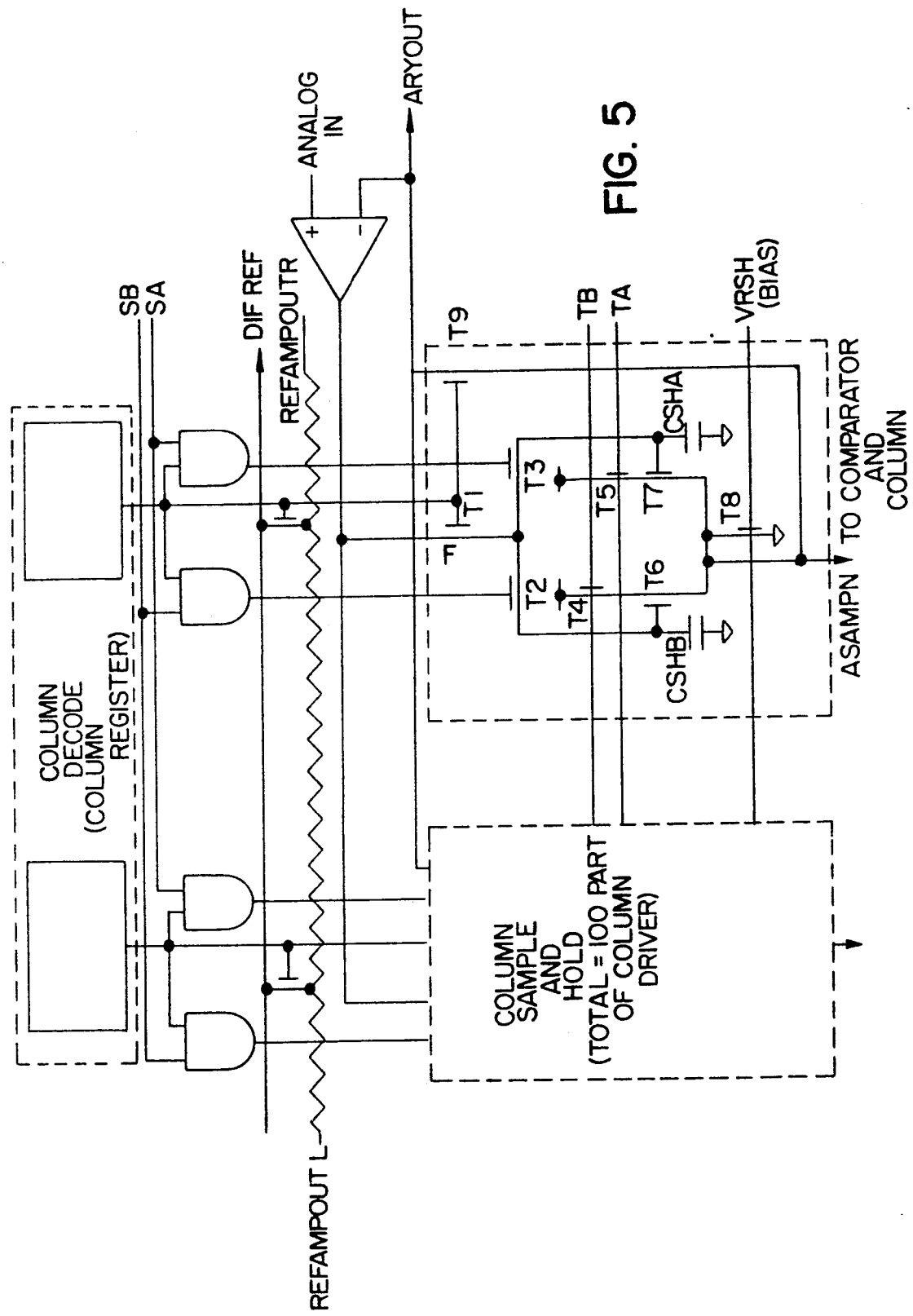

INTEGRATED CIRCUIT SYSTEM FOR ANALOG SIGNAL RECORDING AND PLAYBACK

BACKGROUND OF THE INVENTION

1. Field of the Invention

The present relates to the field of integrated circuit analog signal recording and playback devices and methods wherein an analog signals are directly stored in and read out from a plurality of memory cells.

2. Prior Art

U.S. Pat. No. 4,890,259 discloses a nonvolatile high density integrated circuit analog signal recording and playback system wherein an analog input signal is sampled a plurality of times and then, as additional samples are being taken and temporarily held, a prior set of samples of the analog signal are parallel loaded into a plurality of storage sites or cells, each comprising nonvolatile floating gate memory cells, preferably EEPROM cells. In that system, writing of the groups of samples into the respective storage cells is done by iteratively providing a write pulse followed by a read operation for the respective cells to compare the information stored in each cell with the information held by the respective sample and hold circuit. During the successive write read operations, the write pulse is increased in amplitude, with the write pulses to any cell being stopped or decoupled from the cell when the information read from the cell in the last read operation equaled the value held in the respective sample and hold circuit. To provide time for the successive write read operations, a plurality of sample and hold circuits are provided so that an equal plurality of cells may be loaded or written to at one time. Still, because of practical limitations in the number of sample and hold circuits which may be provided and the limited length of time the integrated circuit sample and hold circuits will accurately hold the sample value once taken, the length of time available for writing the sample signals to the storage cells in this parallel load fashion is limited. Thus, because each write read cycle takes a finite amount of time, the number of such cycles which may be completed before the same number of samples has again been taken and must similarly be loaded is limited. This in turn limits the resolution in the stored information which may be achieved by each write pulse while still allowing for properly storing samples which may be at either extreme of the storage range, particularly considering temperature variations, chip to chip processing variations and the like.

U.S. Pat. No. 4,627,027 discloses analog storage and reproducing apparatus utilizing nonvolatile memory elements. The apparatus disclosed therein utilizes a source follower type floating gate storage cell in a device which writes to each cell in a single write operation, as opposed to an iterative write process wherein successive write read operations provide and verify storage of the desired analog signal. In the implementation used in this patent the write circuits are completely separate from the read circuits so that during read, any variation in the characteristics of the load will produce a corresponding variation in the output. The constant current load, if ideal, would not create distortion but in reality any practical realization would create some disturbance. In addition, the different conditions between read and write significantly reduce reproduction quality.

The present invention represents many improvements, extensions of capability and performance and a substantially higher level of integration in a nonvolatile high density integrated circuit analog signal recording and playback system of the general type disclosed in U.S. Pat. No. 4,890,259.

BRIEF SUMMARY OF THE INVENTION

Integrated circuit system and method for nonvolatile analog signal recording and playback having improved performance and a very high level of integration. The integrated circuit is complete with preamplifier, automatic gain control, filter, fixed references including a band gap reference, trimming, power output amplifier, memory array, multiple closed loop sample and hold circuits, column addressing means, column driver, row decoder, address counters, master oscillator and chip function timing circuits including sample clock, charge pumps, high voltage regulator and waveshapers, low VCC detector, power-on reset, test logic and recording reference circuits on a single chip. The chip is configurable for use of the filter as an antialiasing input filter, as an output smoothing filter or to cut out the filter, preamplifier and/or the output power filter, and for special test modes including mass programming patterns. The system uses a writable nonvolatile analog reference scheme to put many error sources in the common mode, and provides a double ended output for maximum power output in a limited voltage range, and to allow direct connection to a loudspeaker. Trim bits are provided for trimming the oscillator and filter so that the filter characteristics match and track the oscillator frequency and provision is made for absolute addressing and digital end of message markers. Programming is by way of a multi level iterative write process for high resolution, with the chips being directly cascadable. Other aspects of the integrated circuit and its operation are disclosed.

BRIEF DESCRIPTION OF THE DRAWINGS

FIGS. 1A–1C is a block diagram of a preferred embodiment of an integrated circuit analog signal record and playback system in accordance with the present invention.

FIG. 5 is a circuit diagram for the closed loop sample and hold circuits and associated circuitry which compensates for the threshold losses and other non-linearities and manufacturing variations which may exist across the die.

DETAILED DESCRIPTION OF THE INVENTION

Figure 1B:
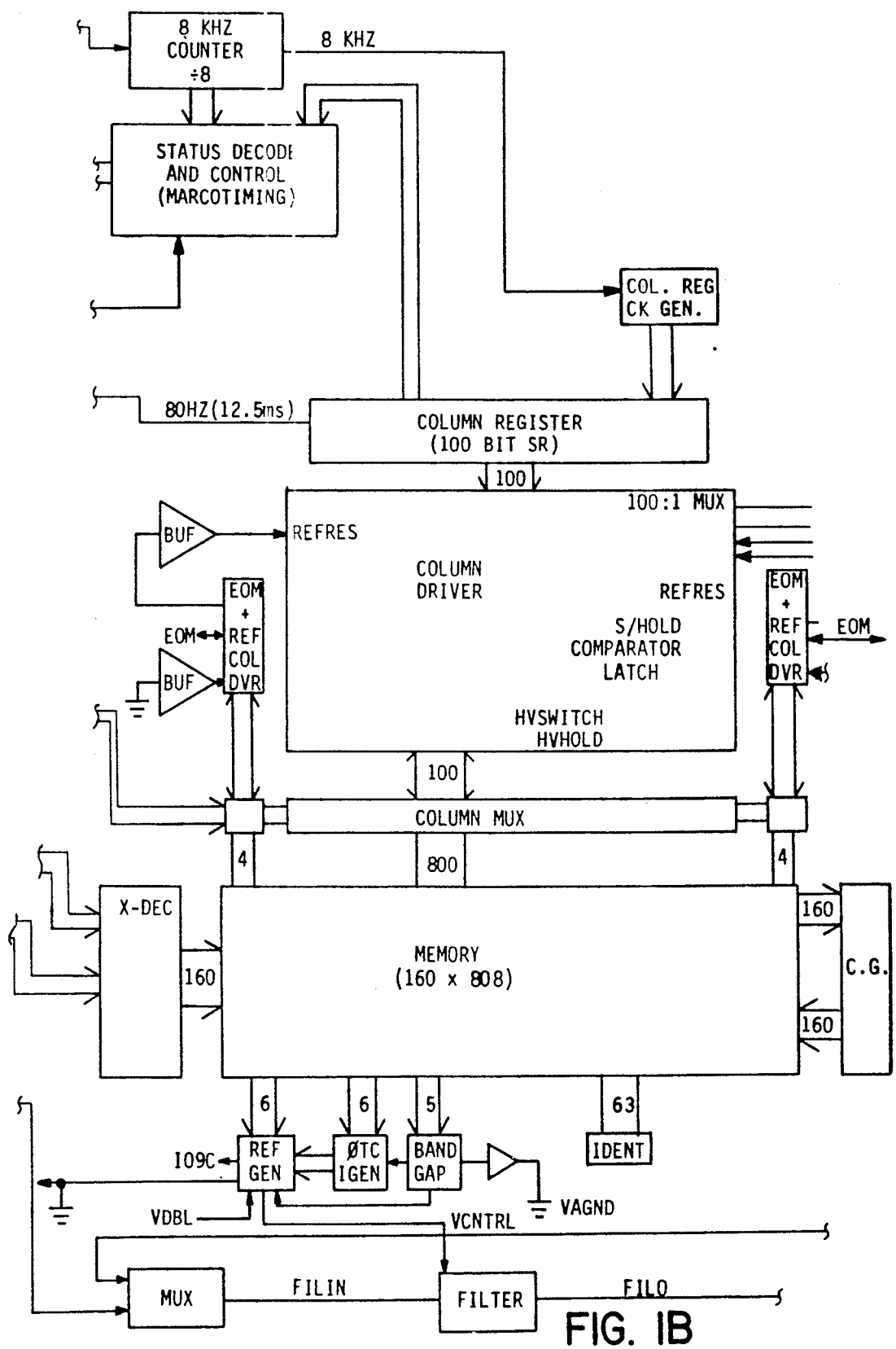

First referring to FIG. 1, a block diagram of the preferred integrated circuit embodiment of the present invention may be seen. The circuit shown integrates all major circuits of a solid state sound recording and playback system. The system consists of three major sections—the analog input and output path; the analog storage array; the digital control and EEPROM support circuits. Power is supplied to the analog section and to the array and digital section from separate VCC and VSS supply pins. In that regard, care is taken to minimize noise coupling between the analog and digital sections, not only from the power supplies, but also from the other signals, by way of the block diagram level design, circuit design, physical layout and pin outs, and board level designs utilizing the device.

The analog section provides the audio interface with the microphone and the speaker. There are two distinct signal paths a) Record path b) Playback path. The Analog section can further be subdivided into the following subsections: 1) preamplifier and gain section with automatic gain control (AGC), 2) filter section, 3) power amplifier section, 4) Interface section and 5) reference section.

Record Mode:

In the record mode the microphone which is capacitively coupled to the MICIN input pin transduces the audio signal into a low level analog signal. This low level analog signal passes through the pre-amplifier with AGC control and gain stage. The preamplifier and the gain stage are also capacitively coupled through an external capacitor. The output of the preamplifier is the ANAOUT pin and the input of the gain stage is the ANAIN pin. The capacitive coupling avoids saturation of the gain stage by blocking the amplified dc offsets of the preamplifier stage. The ANAOUT signal can be used to output the preamplified signal for other external system requirements. The ANAIN input can be used to record already conditioned signals, directly bypassing the preamplifier. The output of the gain stage goes to the filter in the record path and also feeds back to the peak detector. The peak detector detects the peak level of the amplified signal and holds the level on an external parallel resistor and capacitor combination connected to ground at the AGC pin. This level is then fed back to the preamplifier, thus creating a negative feedback loop. This loop limits the maximum level at the input to the filter section for a large dynamic range audio signal at the microphone input. The external resistor and capacitor combination at the AGC pin allows the attack and release time constants of the AGC network to be varied as per system requirements. There is an internal series resistor at the AGC pin as shown in FIG. 1 which in combination with the external capacitor sets the AGC attack time. The use of the internal resistor reduces the number of external components while still allowing control of the attack and release time constants. All of the above comprises the preamplifier and gain stage with AGC subsection.

The signal going into the filter section is called "preampo". The amplified signal "preampo" then passes through an analog multiplexer to the filter and becomes the signal "filin". The filter then bandlimits the signal "filin" and processes it to produce the signal "filo", which then passes through another analog multiplexer to the interface section. At this point the signal is called "analogin". The purpose of the analog multiplexers is to place the filter in the antialiasing/bandlimiting function during the record mode and in the smoothing function during the playback mode. The use of the filter both for the purpose of antialiasing/bandlimiting and smoothing makes more efficient use of silicon real estate. The filter is a MOSFET-RC fifth order low pass Chebychev type. MOSFET transistors are operated in the linear region with a suitable gate voltage to act like resistors. Low threshold MOSFET devices are used in the implementation of the MOSFET-R to provide a larger signal dynamic range with low distortion in the filter. Also a fully differential scheme is used in the filter for lower signal distortion. Using a differential technique also helps with respect to power supply noise rejection. A closed loop dc control loop maintains the gates of all the MOSFET-Rs at the proper level to generate the effective resistance required for the filter time constants. This gate voltage "vcntrl" comes from the control loop in the reference subsection. This loop locks the filter time constants with the on-chip oscillator time-period, and the two track each other, thereby meeting the Nyquist criterion as applied to sampled data systems. A high voltage supply three times the chip supply is also generated on-chip to supply the dc control loop for "vcntrl", such that "vcntrl" has a much wider control range depending on process, temperature and power supply changes, and so that it does not get limited by the power supply. Also there are test modes implemented in the chip that allows direct access to and from the array, thereby by-passing the filter. This facilitates high speed testing of the array.

Playback Mode:

In the playback mode the interface subsection receives two signals, "aryout" and "difref" from the column driver subsection. These two signals go into a switched capacitor differencing amplifier to generate a sampled signal equal to the difference of "aryout" and "difref". This difference signal is held in a sample and hold circuit, the output of which is the signal "diffo". The differencing amplifier and sample-hold network is shown as the amplifier DIFAMP in the block diagram of FIG. 1.

The "diffo" signal then passes into the filter subsection. At this time the input and output analog multiplexers are set in a manner such that the filter is switched into the playback path and performs the smoothing function on the rather staircase like difference signal "diffo". The output of the filter subsection then passes into the power amplifier subsection. At this time the signal is called "pwrin".

The "pwrin" signal is coupled to the power amplifier subsection and first passes through an analog multiplexer. The multiplexer lets either the "pwrin" signal or the signal at the AUXIN input pin pass through to the power amplifier. The power amplifier can thus be used independently for system power amplification requirements. This feature also helps with cascading of multiple chips for extended record and playback duration. The power amplifier itself takes a single ended input and converts it into two separate power output signals of equal amplitude and opposite phase. The two power outputs are called SP+ and SP−. This allows a speaker to be directly connected to the two power outputs without the need for any other external components such as a capacitor, and at the same time allows the speaker to transduce four times more output power for the same signal level. This also provides more power output with limited signal dynamic range and low distortion levels. During the power down mode, the power amplifier outputs are pulled low to provide a low impedance path to ground. This keeps the chip from latching-up due to speaker flyback effects such as occur due to mechanical shocks or vibration. The input to the power amplifier is under the control of the chip-enable signal $\overline{CE}$. Preferably the power amplifier section is a unity gain stage to facilitate cascading of multiple chips.

Figure 2:
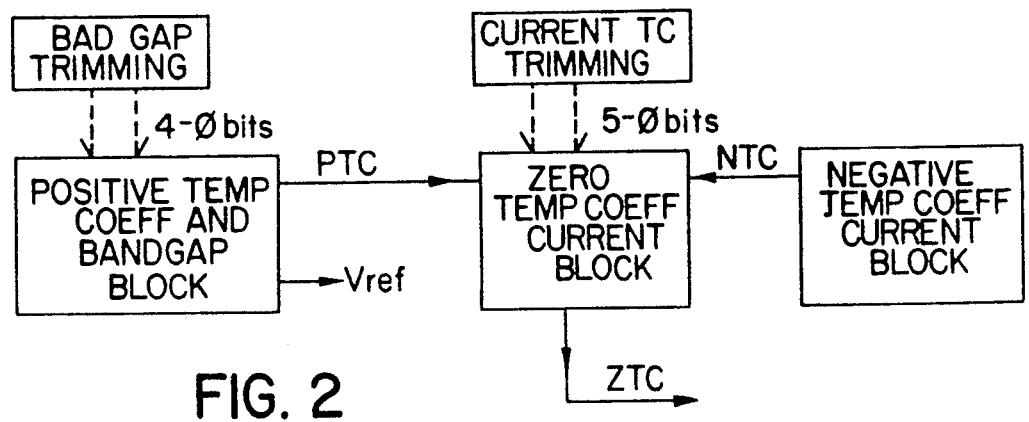
FIG. 2 is a block diagram level representation of a trimming hierarchy in the reference generation block of the circuit which makes use of certain EEPROM cells, allowing the same to be programmed to suitable digital values to set the optimum voltage reference and current reference with the proper temperature coefficients.
Figure 3:
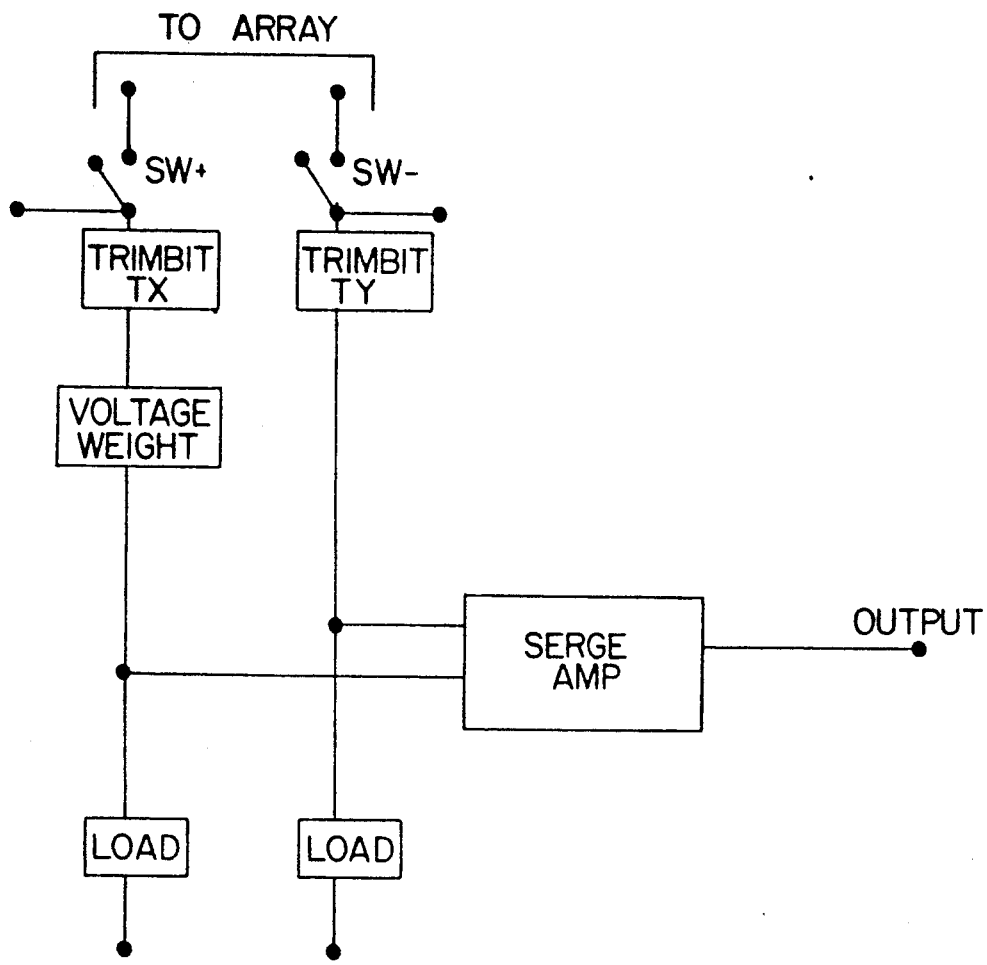
FIG. 3 shows the dual cell differential weighted sensing scheme for the trim cells.

The reference subsection provides all the voltage and current references as required for the chip. Circuits within this section are disposed around the chip to provide for distributed references. This section also contains the dc control loop which locks the filter time-constants and the oscillator time-period and provides the MOSFET-R gate signal "vcntrl" to the filter section. There is a trimming hierarchy in the reference generation block which makes use of certain EEPROM cells, allowing the same to be programmed to suitable digital values to set the optimum voltage reference and current reference with the proper temperature coefficients. FIG. 2 shows the block level representation of this trimming hierarchy. The applicable EEPROM cells are referred to as trim cells, and are part of the core EEPROM array. Two cells with differential logic level programming are used to set a value for one trim bit. A differential amplifier with input weighting is used as the sense amplifier for each pair of trim cells and generates the logic level for each trim bit. The input weighting is used to define the output to a default level when the trim cells are in their native unprogrammed condition. The dual cell differential scheme provides more reliable trim bit logic setting over process changes and life time of the chip. FIG. 3 shows the differential weighted sensing scheme. TX and TY are a pair of trim cells which are required to be programmed with opposite values for the differential technique. A voltage weight is applied to one of the sense inputs. This sets the default value at the output of the sense amplifier. To set the output to a value opposite to the default value, an overriding opposite type of differential value has to be programmed across the sense amplifier inputs through the trim cells. SW+ and SW− essentially connect the trim cells to the array and then to the column drivers during programming and disconnect the trim cells from the array during sensing. FIG. 2 has a positive temperature coefficient current and bandgap voltage generator. There are five trim bits for setting the optimum voltage "vref" such that the temperature coefficient of "vref" is small. By changing the bandgap trim bits it is also possible to have either a positive temperature coefficient or a negative temperature coefficient for "vref". From the bandgap block, positive temperature coefficient current "PTC" is also derived and used in the zero temperature coefficient current block. This block also gets a negative coefficient current "NTC" from the negative coefficient current block. The current TC trimming bits control the relative proportions of the positive and negative temperature current addition in the zero temperature coefficient current block. The output current "ZTC" in fact can either be a positive TC or a negative TC or a zero TC current depending on the setting of the current TC trimming bits. All these bits are set during testing and give the capability to trim the chip for meeting specification and enhanced performance over wide variations of an uncharacterized process. The "ZTC" current is then used in the oscillator and the dc control loop for MOSFET-R gate signal "vcntrl". There is also a regulator on-chip, part of the reference subsection that provides the biasing to the array during playback. This regulated supply "Vcca" helps with supply noise rejection during reading of the array cells.

Figure 4:
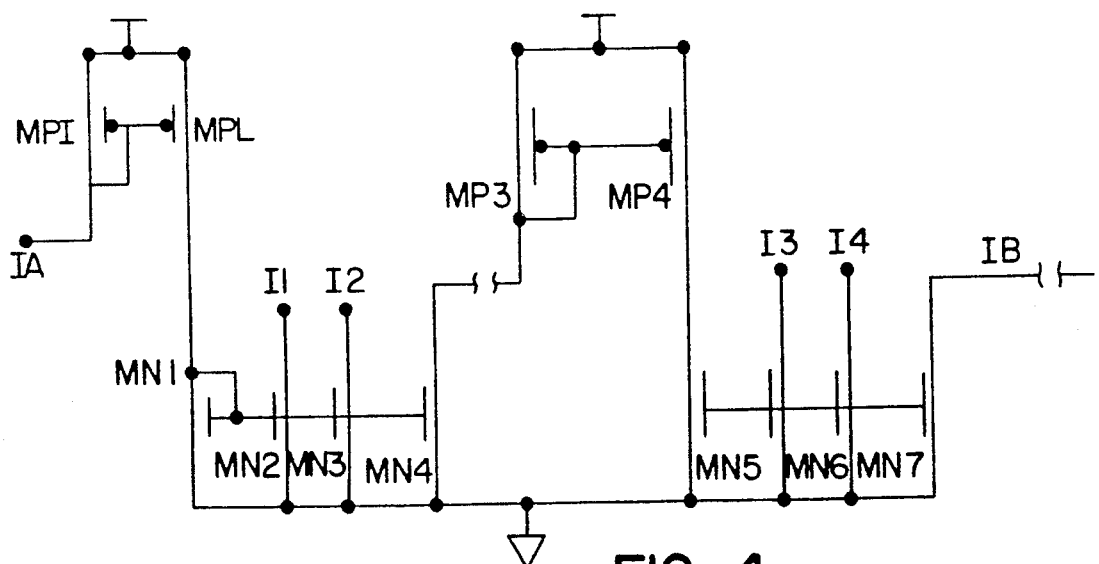
FIG. 4 is a circuit diagram illustrating the current bias distribution scheme.

DC operating point bias, as required by all analog subsections, is distributed around the chip through a current bias distribution scheme shown in FIG. 4. Current is in fact carried from one place on the chip to another. This does not create problems of inaccurate biasing as is possible with voltage biasing wherein problems are normally caused by IR drops across power lines and mirror transistor threshold mismatches across the chip. Circuitry incorporated on the chip manages the power dissipation of the chip depending on the mode of operation such that subsections not operational during certain modes are powered down. For instance, the preamp and gain stage sections during the playback mode, and the power amplifier section during the record mode, are respectively powered down. This helps to bring down the average power dissipation of the chip. Note that since the chip operates from a single 5 V supply, an internal analog ground is also generated, which provides for the ground reference for all analog signals. This analog ground reference is suitably chosen to provide for the optimum signal dynamic range throughout the system with minimum distortion. The analog ground reference is called "Vagnd". In the particular embodiment disclosed, it is at +1.5 V with respect to Vss.

Referring to FIG. 1 again, ANALOG IN is the signal used as the analog input to the memory array. ANALOG IN is sampled at a frequency of 8 Khz onto the dual sample and hold arrays. As described in the Simko patent (U.S. Pat. No. 4,890,259), storage is done in a sequential manner onto two banks of sample and hold capacitors. As one bank is being loaded serially (at the sample frequency), so the other bank is used to output its contents in a parallel fashion to the write circuits. In this manner the analog signal is sampled continuously without interruption while the page mode type writing process is taking place simultaneously.

Now referring to FIG. 5, loading of the sample and hold circuits is done with a circuit which compensates for the threshold losses (and other non-linearities and manufacturing variations) which may exist across the die. ANALOG IN is applied via an amplifier, through the transfer gates (T1 and T2 or T1 and T3) which are enabled by the column decode and transferred onto the sample and hold capacitor (CSHA or CSHB). T8 is a current load device which forms a load for the voltage follower transistors T6 and T7. There are two possible paths from the output of the amplifier, namely through T1, T3, CSHA, T7 and T9, or through T1, T2, CSHB, T6 and T9. When side A is in use, then T2 and T4 remain off; when side B is in use, then T3 and T5 remain off. The column decode ensures that only one sample and hold circuit is selected at any one time. Since the transistors T1, T2/T3, T6/T7, T9 are in the feedback path, any voltage loss or gain through the transistors is compensated by the amplifier action which adjusts the amplifier output until the level at the inverting input is equal to ANALOG IN. The voltage range over which the loop action occurs must be equal to or greater than the signal dynamic range which is to be stored. The circuit shown here uses only N-type transistors for T1-T9. This implies that the signal dynamic range is less than VCC by an accumulation of threshold drops through T1-T9. Use of N-type and P-type transistors as a no-loss transfer device to replace T1, T2, T3 and T9 would increase dynamic range; as would use of low threshold values (e.g. a native device for T6 and T7). The column decoder (or column register) selects each sample and hold circuit in turn at a frequency equal to the sample rate. The signals SA, SB, TA and TB are manipulated so that each bank of sample and hold capacitors are loaded in turn. When all the capacitors in one bank have been loaded (say bankA) i.e. when the column decoder reaches its upper limit, then the column decoder returns to its lower limit and the other bank of capacitors (say bankB) are then loaded. SA and SB act as strobe signals and have a time duration less than the period of the sampling frequency. In each (125 $\mu$sec) sample period, either TA (and SA) or TB (and SB) are brought high to turn on the appropriate source follower and connect it into the control loop. After sufficient time has been given for the loop to settle, SA (or SB) is taken low and the capacitor now holds its stored value. TA and TB are now toggled so that the stored value on the other capacitor is brought through the source follower and onto the node ASAMPN which goes to the comparator. At this time, all the stored values are output in parallel from the sample and hold circuits into the comparators.

In the preferred embodiment there are 100 similar pairs of sample and hold capacitors and source followers. Consequently each (100×125 $\mu$secs) 12.5 msecs a new set of values appear on the 100 ASAMPN parallel outputs. The writing circuits are therefore allowed 12.5 msecs in which to write the values into the memory array before the next set of values appears.

Figure 6:
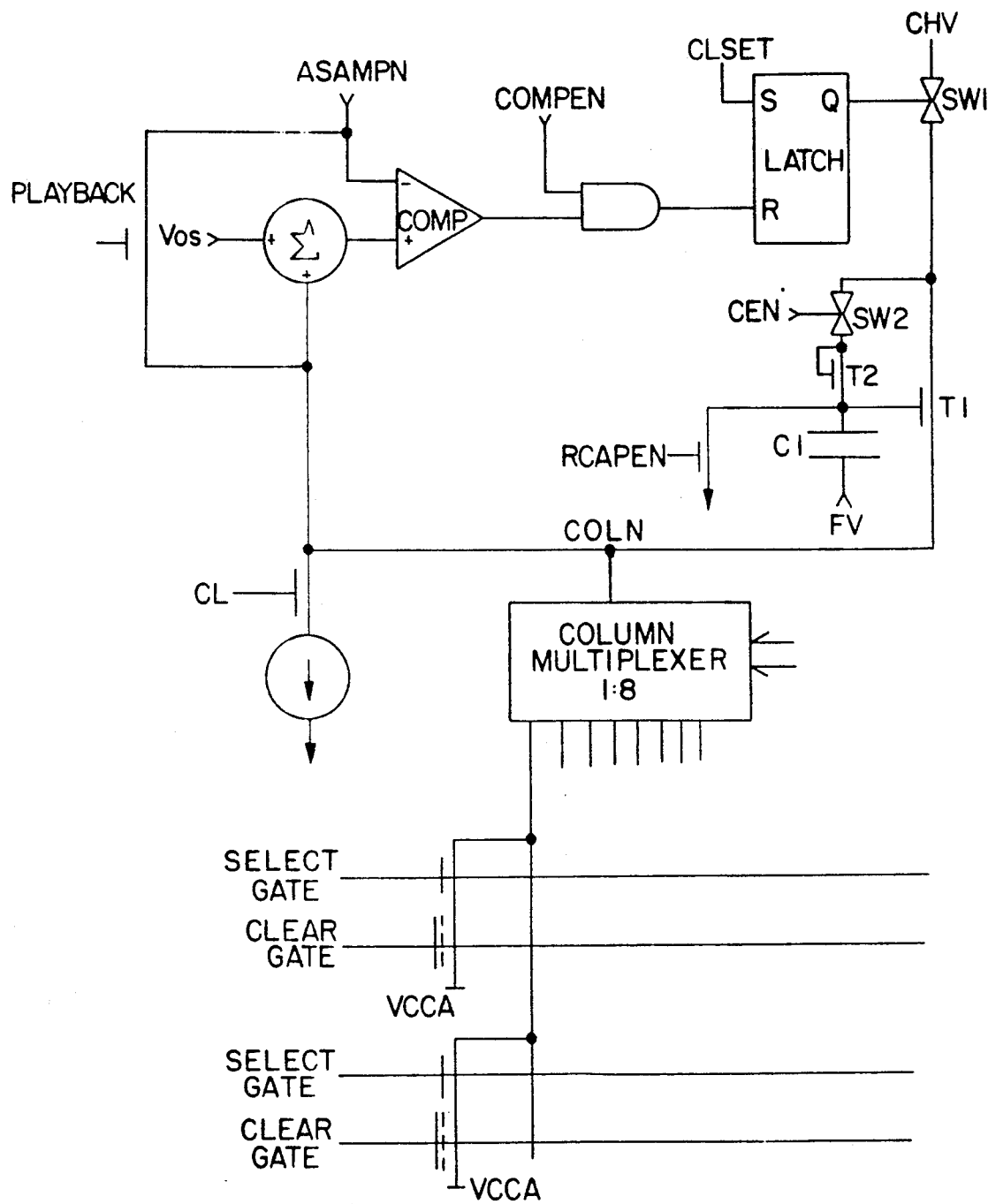
FIG. 6 is a schematic diagram for the circuit used for the dual level iterative write of the present invention.

Referring to FIG. 6, the writing process takes place by successively applying high voltage pulses to the column, configuring the memory into the read mode, reading the stored value from the cell, comparing the result with the required value on ASAMPN, and then repeating the process if the value is less than ASAMPN using pulses of increasing amplitude. In order to obtain improved resolution, the writing process is done in two stages; these are referred to as the coarse cycle and the fine cycle. (A simplified scheme would also work—i.e. elimination of SW2, the Vos adder and the FV storage capacitor and using only the coarse cycle. However the coarse/fine cycle allows better resolution.) All the cells in the row are first cleared by applying a high voltage to the clear gate of that row while keeping the drain (i.e. the column node) at VSS. (The preferred embodiment clears only the addressed row, and if the recording carries over into subsequent rows, then a clear pulse must be applied at the beginning of every row. However, if the application allows, then the complete array could be cleared by connecting all the clear gates together and applying a single high pulse to all rows at the beginning of the write cycle.) A pulse is applied to CLSET to set the latch and enable (open) SW1 and a single pulse is applied to RCAPEN to discharge the capacitor C1 to VSS. CEN is held high for the complete coarse cycle and low for the fine cycle i.e. SW2 conducts only during the coarse cycle. The first high voltage pulse is applied to CHV and consequently to the addressed column. Only one Select Gate is high so the high voltage is applied to the drain of the addressed cell. The array is then configured into the read mode and the addressed cell contents are read through the column multiplexer to COLN. In readback mode the VCCA node is taken to a positive voltage, CL is taken high and a current load to a negative level (in this case VSS) is applied to the cell. (CL is held low during the high voltage pulses.) After an increment Vos has been applied to COLN, the result is compared with ASAMPN. At the appropriate time (allowing for settling of the comparator COMP and also the interleaving of the high voltage pulses), COMPEN is pulsed to enable the reset path into the latch. If (COLN+Vos) is less than ASAMPN then the latch remains set and subsequent high voltage pulses are applied to the column, but if (COLN+Vos) is greater than ASAMPN then the latch is reset, SW1 is opened and further high voltage pulses are blocked. Sufficient high voltage pulses (of a monotonically increasing level) are applied to ensure that the cell could be programmed to a level corresponding to the maximum level. Once the latch is reset, and SW1 remains open, the voltage on C1 remains stored for the remainder of the coarse cycle due to the action of T2 which acts as a reverse diode at this time. Hence the level stored on C1 is the level which produced the last high voltage pulse to the columns. At the end of the coarse cycle, the latch is set once again by a pulse on CLSET and another series of high voltage pulses appears on CHV. Whereas in the coarse cycle the pulses were of continually increasing magnitude; in the fine cycle they are all of maximum amplitude. The level which is actually applied to the column, however, is determined by the voltage stored on C1. This stored value is modified by the signal FV applied to the bottom plate of the capacitor. During the coarse cycle FV is at a fixed voltage (2 V). At the beginning of the fine cycle FV is taken to 0 V and then ramped up continuously during the fine cycle to a positive voltage (2 V in the preferred embodiment). Thus, the first high voltage of the fine cycle is 2 V lower than the high voltage pulse which caused the comparison during the coarse cycle. Each successive high voltage pulse of the fine cycle is slightly higher than the previous pulse by a value which is determined by the ramp rate of FV. It is not necessary for FV to be a smooth linear ramp—a continually increasing level, such as a staircase incremented by small amounts at each successive high voltage pulse would also serve the purpose. After each high voltage pulse, the cell is returned to the read configuration and COLN is compared to ASAMPN. During the fine cycle, however, there is no addition of Vos (or Vos is kept at 0 V). The charge increment which is added to the cell is relatively small during the fine cycle and consequently there is improved resolution and writing accuracy. At some time during the fine cycle, COLN will exceed ASAMPN, the latch will be reset and the remaining high voltage pulses will be blocked by the opening of SW1.

The end of the fine cycle is coincident with the column register reaching its maximum value i.e. a new set of samples has been laid into the sample and hold capacitors. The manipulation of the TA, TB, SA and SB signals is now reversed and a new set of parallel ASAMPN values is presented to the comparators. The inputs to the column multiplexer are also changed so that a new set of columns are connected to the column drivers. The time period where the column register passes from minimum through its maximum and returns to its minimum will be referred to as a scan. The procedure is then repeated for the next scan or set of 100 cells. After a total of eight scans (i.e. a total of 800 cells) have been written, the row address is incremented and a new row is selected. In this case a clear pulse must be applied before beginning the write procedure.

The particular details for the preferred implementation are:
- 45 coarse pulses beginning at 9 V (at the column) and increasing linearly up to 18 V. The high voltage coarse pulse ramp rate is 420 mV/microsecond, with a pulse width of 109 microseconds repeating every 125 microseconds.
- 90 fine pulses of 18 V maximum (at the column; due to the voltage drops in the switches and T1 this corresponds to about 21 V at CHV). Ramp rate is 840 mV/microsecond, pulse width 47 microseconds and a repeat period of 62.5 microseconds.

FV ramp is 0 to 2 Volts in 5.625 milliseconds. Vos (effective after division due to circuit implementation) is 0.2 V.

Programming does not necessarily take place at the extreme ends of the coarse and fine cycles. At the beginning of the coarse cycle the high voltage level is too low to produce a read voltage greater than 0 V (tunneling may be taking place but the floating gate may be highly erased and has a high enhancement threshold). At the end of the coarse cycle all latches have been reset—even for the columns which have ASAMPN levels at the maximum (3 V for the preferred embodiment). At the beginning of the fine cycle the reduction in high voltage due to the 2 V decrement on C1 reduces tunneling currents to very small levels. Similarly at the upper end of the fine cycle all latches have been reset. This margin at each end of the coarse and fine cycles is quite wasteful since, if the minimum and maximum high voltage pulse levels could be brought closer together in both coarse and fine cycles, then the voltage increments could be reduced, thus producing an improvement in resolution. However, it is necessary to include these margins to ensure the full dynamic signal range without clipping that might otherwise occur with changes in cell programming behavior due to variations in tunnel thresholds, cell capacitor ratios and other process variations that take place in a real manufacturing environment. A possible embellishment would be to adjust these margins and the associated ramp rates, Vos etc. by the use of trimming. Thus, conditions would be optimized for individual characteristics and improved resolution could be achieved.

The comparator used in the column driver is of the type described by Yen S. Yee, et. al., IEEE J. Solid State Circuits, pp. 294-298, June 1978. This comparator has the advantage of being small (in terms of silicon utilization) but also it has a very small offset due to the auto-cancellation mode of operation. This has special significance for the preferred embodiment because any random offset of each comparator across the row of column drivers would manifest itself in this offset pattern being superimposed on the recorded signal. Such offset is not a variable that is compensated for in the closed loop writing scheme and would consequently be present on the playback signal. The systematic offsets e.g. the clock feedthrough into the coupling capacitors, is not a concern because this is equal for all comparators (to a first approximation) which results in a d.c. shift of the recorded level. Even this is not a concern because there is an equal shift in the reference voltage which is subtracted during playback.

The description so far is based on a source follower configuration for the memory cell. It would also be possible to realize a working system with the more usual inverter-type configuration but loss of linearity and resolution would occur. The signal from the array would effectively be inverted so the write loop would need to accommodate this, i.e. high voltage pulses would continue to be applied to the column until COLN was less than ASAMPN. For instance the inputs to the comparator could be switched.

Any time that the array is placed into the read configuration, the selected clear gate is taken to a fixed voltage. The value of this voltage determines the amount of charge that is coupled from the clear gate onto the floating gate and can therefore be used to adjust the range of read voltages for a given set of clear and program conditions and cell characteristics. A voltage is also applied to VCCA, the positive supply for the source follower. In the preferred embodiment, the clear gate voltage and VCCA during read are both connected to a 4 V regulated supply. This is derived from the VCC power supply, but due to the regulation (the reference for which is the bandgap voltage), the voltage is stable and has relatively low levels of superimposed noise. In the case of the clear gate this is important due to the direct coupling onto the floating gate. VCCA is also important due to coupling from the VCCA diffusion to the floating gate—in some EEPROM transistors this capacitance can be high due to the increased gate to source/drain area caused by implants which are not self-aligned to the gate structure. Reduced noise coupling onto the floating gate during read improves the noise level during record and playback.

During playback, the array is configured into the read mode, CL is taken high and the nodes COLN and ASAMPN are gated onto ARYOUT via T9 of FIG. 5. The addressing during playback is also sequential, so the signal on ARYOUT is the recomposed sampled analog waveform. Note that ciphering or encoding can be done by using different addressing schemes between playback and record. Provided that the differences are known by a user, the original form can be reconstituted by the user and not by an interloper having access to the encoded playback information.

In addition to the 100 signal column drivers, there are two additional column drivers, one at each end of the array, for writing the reference columns and the EOM (End of Message) columns (See FIG. 1 and also FIG. 5). The reference column driver is basically the same circuit as the other column drivers. Instead of ANALOGIN, however, the input signal is a fixed reference voltage, VAGND, which is written into two additional columns at each end of the array. During playback the recorded reference voltage is input, together with ARYOUT, into a differencing amplifier. The purpose of this is to compensate for effects which would otherwise be detrimental to playback quality—the different hold times on sample and hold circuits across the row of column drivers (and consequently the different leakage amounts); and the changes in read voltages due to threshold temperature shifts, changes in the clear gate voltage and other changes in the environment. During playback a signal DIFREF is created by the reference system and is subtracted from ARYOUT by the differencing amplifier described previously.

Two columns at each end of the array are used to allow for any difference in behavior of the two banks of sample and hold capacitors that may exist due to circuit design, timing or physical layout. The total of four reference columns are written during the writing of the first scans—two columns during each scan. During the writing of the remaining six scans in the row, the output of the reference column driver is not connected to a column. The reference column drivers is not connected to a column. The reference column drivers receive their decode input from the column register bits belonging to the adjacent column driver. Thus the length of time that the sample and hold capacitor must hold its voltage is equal to the hold time of the adjacent column drivers and will consequently suffer an equal amount of charge loss due to leakage. (This may not be precisely true due to local irregularities in the physical structures; however, it is approximately the case and at least will exhibit the same tendencies.) During playback the recorded reference voltage from each end of the array is read from the reference columns, is buffered by an analog buffer, and connected into each end of a linear resistor (see FIG. 5) which extends along the row of column drivers. The selected column driver then connects the resistor tap at its own location along the resistor into the node DIFREF. Thus the node DIFREF is at a voltage which is between the stored reference voltages and of a value which is proportional to the length of storage time of the addressed column. (The dimensional length of the resistor in the physical layout is the same in each of the column drivers and so the resistance value from one end to the other increases linearly along the length of the row of column driver.) The voltage on DIFREF is therefore representative of the voltage loss due to charge leakage at the sample and hold capacitor of the addressed column driver. This function of the reference columns and associated reference resistor is especially important at high temperatures when charge leakage is increased. An additional function of the reference system is to compensate for changes in transistor threshold voltage with temperature. The voltage read from each cell varies with temperature and would be observed as a change on the level of ASAMPN during playback. Since all the cells are at the same temperature (as a first approximation) there would be resultant DC shift in voltage. This is not particularly important for speech recording, but if the DC voltage is desired to be maintained unchanged (as is the case for some applications) then the reference system will compensate for this by subtraction at the differencing amplifier.

As well as the two reference columns, there are an additional two columns at each end of the array. These columns store digital values and are used to indicate an end of message (EOM). Since the data is in less sensitive digital form, the columns are positioned at the outside of the array. This also ensures that the reference columns have memory cells on all sides (just as the rest of the analog array). The surroundings of each cell is therefore identical, allowing for consistent manufacturing and similar electrical conditions. This is important for the reference columns, but not so critical for the EOM columns. The EOM functions in the following manner. A recording may be terminated by a request from the control pins ($\overline{CE}$ or PD). The input logic transmits this request to the EOM column driver and high voltage programming pulses are passed to the EOM columns. Either the EOM cells remain fully erased or they receive all the available high voltage pulses in the event of an EOM request being received from the input logic. Message length increments of 25 msecs is considered adequate, so an end of message is allowed at the end of every second scan. This means that there are four possible EOM positions on every row. With four EOM columns available a simple one-shot assignment is implemented. It would also be possible to encode the position for the end of message. If the position resolution of the end of message is 12.5 msecs (a scan), then three columns and eight possible programming combinations could be utilized. Alternatively, eight columns could be used, resulting in no decoding being required to determine the EOM position. During recording then, the EOM column driver passes high voltage pulses whenever a EOM request is received from the input logic. This is directed to only one of the four possible EOM columns depending on the path selected by the column multiplexer. The recording is then terminated by disabling the write circuits. The result is to have erased EOM cells for the complete duration of the recorded message, except for the cell which is addressed at the end of the message—this cell is programmed. During playback, the EOM columns are continually monitored—they are connected into the same read configuration as the rest of the array. When a programmed cell is addressed, a high level is detected and this signal is transmitted to the input logic. The playback may be automatically terminated, depending on the state of the control circuits. The $\overline{EOM}$ pin is taken low to indicate that an EOM condition was detected. This eliminates the need for the end of message address (location) to be known by the external control. The external controller simply instructs the preferred embodiment to begin playback from a start address and the chip will stop automatically at the end of message and/or signal this condition by pulsing the $\overline{EOM}$ output.

An extra row of cells is included at the opposite end of the array to the column drivers. This row, referred to as the trim row, is connected into the array i.e. to the columns and to a special row driver, through a set of transistors that are turned on only during a particular test mode. In this test mode, the trim row is selected and can be written to and read from through the column drivers. When the device is not in this test mode, the trim row is configured into the read mode. Some of the cells in the trim row are connected in pairs to the inputs of a weighted differential amplifier, as described previously, to provide the trim bits. Other bits in the row are available for storing information—in either analog or digital form—for access only during test mode. The advantage to using the extra row is that the existing writing circuits (column drivers and X pre-decode) can be utilized. The trim bits are required continuously by the trimming networks in the form of a parallel output. This arrangement provides this without the need for large amounts of additional hardware.

Figure 7:
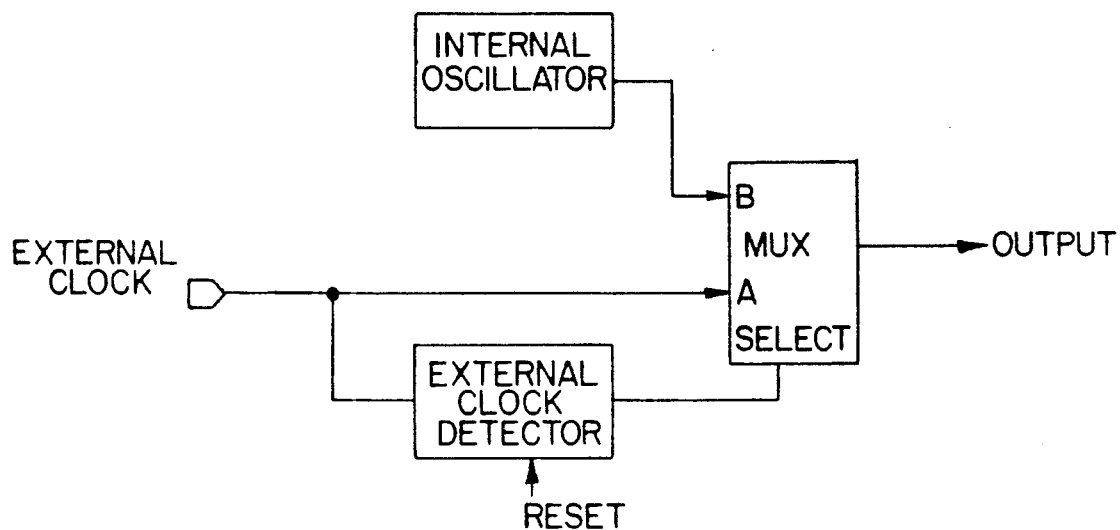
FIG. 7 is a block diagram of the clock circuit of the present invention.
Figure 8:
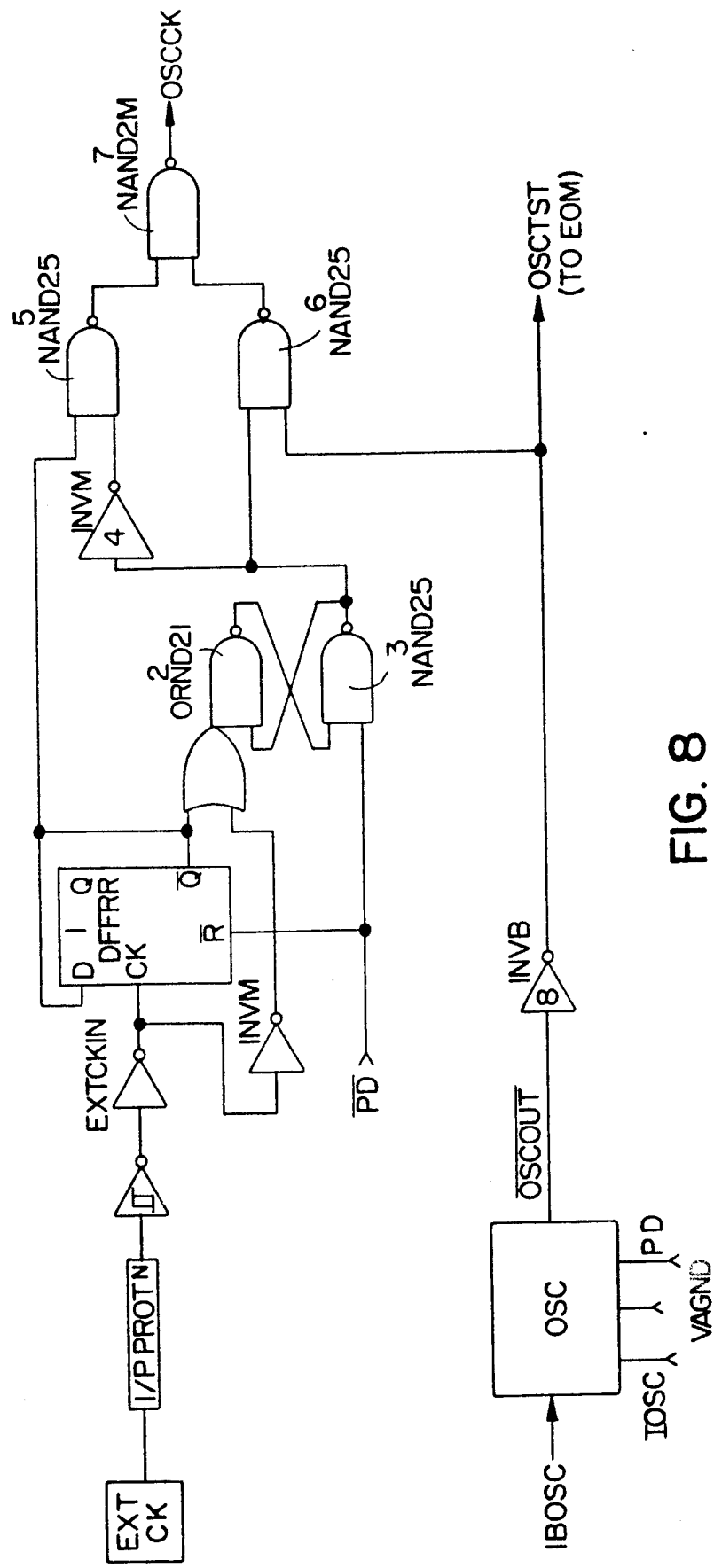
FIG. 8 is a circuit diagram of the clock circuit of FIG. 7.

The timing for the chip is derived from a single timebase (See FIG. 7 for a block diagram and FIG. 8 for the preferred circuit). An on-chip oscillator which has no external components is used to derive all the required clocks and timing signals. The nominal output frequency is 512 Khz. An input pin is provided should it be necessary to synchronize the chip to external clocks or timebases. In this event the external oscillator block detects the presence of an incoming frequency and steers the external clock to the 512 Khz output. If external synchronization is not required, the external clock pin is connected to either power supply pin, and the external oscillator block gates the internal oscillator to the 512 Khz output.

The internal oscillator is of the relaxation type and operates on the principle of charging a capacitor to a certain voltage by applying a certain current. Both the current and the voltage levels are obtained from the reference section—the voltage is fixed (VAGND) and the current is variable, however it would also be acceptable for this to be reversed. In fact two capacitors are used to allow for the discharge of one capacitor while the other is being charged, thus providing a more accurate discharge voltage and reduced signal propagation delays in the sections of the circuit which perform switching. The output from the oscillator is used by the 64 Khz counter and subsequently the timing circuits and sample clock. However, it is also routed through additional test logic to an output pad ($\overline{EOM}$). If the correct test mode is selected the oscillator output is directed to the EOM pad, thus allowing the oscillator frequency to be measured. The variable parameter (in this case current) is adjusted by modifying the appropriate trim bits until the oscillator frequency is at the desired value. This of coarse adjusts the sample frequency by the same proportions and, as described previously, since the variable current is derived from the same source as that which sets the filter roll-off frequency, the filter characteristics track the oscillator and change by the same proportion. The ability to trim the oscillator frequency allows an accurate setting of sample frequency and consequently the maximum recording capacity of the array. Another advantage is that it allows sample frequency to be adjusted to suit the application. Reproduction quality can be improved by increasing sample frequency (at the cost of reduced record duration). However, if the application requires longer duration then this can be achieved at the cost of quality—trimming allows either from the same part. It is also critical that the oscillator be stable over various operating conditions such as temperature and power supply levels. If there is any variation in sample frequency between playback and record then the reproduction quality is effected—+/−2% is considered to be the maximum acceptable variation for voice recordings. Use of the stable current and voltage outputs from the reference section provides this stability.

As shown in FIG. 1, the output from the external oscillator is directed into the 64 Khz counter. The 64 Khz counter in turn produces the clock input for the 8 Khz counter. The 8 Khz output is then buffered by the Column Register Clock Generator (COL. REG. CK GEN. in the block diagram of FIG. 1) to create the column register clock pulses. Whenever the chip is powered down or deselected, the clock generator applies a reset to all stages of the (100 bit) column register. At the beginning of every record or playback operation the clock generator loads a logic "1" into the first stage of the register. With each subsequent 8 Khz clock the logic "1" is shifted along the register—all other stages are at logic "0". The output of the last stage produces the 80 Hz clock for the column multiplex counter and is also returned to the first register stage so that the logic "1" cycles through the column register repeatedly. The single logic "1" from the column register is used to successively select the column driver and perform the sampling into the sample and hold capacitors during record and out from the column drivers during playback. (The column register function could also be performed by a (modulo-100) counter and decoder). The column multiplex counter is a modulo-8 counter and provides the inputs to the 8:1 column multiplexers. The carry output produces the 10 Hz clock for the row counter and is also used in the status decode and control block.

The status decode and control block receives inputs from the column register, column multiplex counter and the 8 Khz counter. Its purpose is to provide the higher level timing control (or macrotiming), particularly for the write operation. The complete write cycle is accomplished in the time required to write one complete row—clearing is performed one entire row at any one time. Eight times during each row, or once during each scan (i.e. each passage through the column register) the write circuits must execute the coarse and the fine cycle. In terms of timing, then, each row and also each scan must be subdivided into different time slots, during which there are unique control sequences to be performed. The states of the address circuits are used to define these time slots and consequently also used to derive the control signals associated with clear, coarse and fine cycles.

Further subdivision is done by the 8 Khz counter. For instance, during each sample of 125 microseconds there are periods of high voltage activity interleaved between the sample and compare operations of the column driver. These different activities take place in each sample period under the control of signals created by outputs from the 8 Khz counter. All high voltage activity is halted and also additional settling time is given to minimize the amount of electrical disturbances that would otherwise occur if the high speed switching of relatively large capacitances was allowed to take place simultaneously with the more sensitive analog operations. The separate high voltage and compare events are not necessarily limited to a single sample period; nor is each event necessarily completed in a single sample period. For instance, the clear pulse takes place over ten sample periods without any comparisons, a coarse pulse and one comparison take place in one sample period and there are two fine pulses and two comparisons in a sample period. The fine resolution of the control signals (microtiming) within each of the previously defined modes is done by the outputs of the 64 Khz counter. Signals such as SA, SB, TA, TB and others which are required to be switched at short time intervals are controlled by the 64 Khz counter.

The output of the column multiplex counter not only goes to the status decode and control logic, but also to the input logic (where it is used as a switch debounce clock), to the row counter and to the column multiplex high voltage buffer. In order to multiplex the column driver onto the columns it is necessary to use high voltage signals to drive the switching transistors. To minimize the number of level shifters, the outputs from the multiplex counter are level shifted and the high voltage outputs used to drive a multiplexer which selects the connection path through several transistors connected in series.

The row counter is clocked by the 10 Hz output from the column multiplex counter. It is a binary counter which may also be preset to a value given by the address pins A0 through A7. The logic level outputs from the most significant bits of the counter drive the X-decode; the outputs of the two least significant bits drive the X pre-decode. The outputs of the pre-decode are level shifted such that the selected output is at a value equal to CHV during write and equal to MHV during read. MHV is a voltage of about 12 V which is generated internally from a charge pump. Unselected outputs are taken to a low voltage. The selected X-decode connects the four pre-decode lines onto the select gates of the array row. The unselected X-decodes connect a low voltage onto the other rows. The low voltage may be VSS, but in the preferred embodiment it was chosen to be about 1.5 V—a level slightly higher than VSS. The purpose is 1) to have unselected row select gates at 1.5 V, and thus raise the voltage to which the column can be taken without experiencing a current path to substrate caused by gated diode breakdown at the drain regions formed by the column and the select gate; and 2) to increase the source voltage of undesired (field) transistors which are formed by interconnect layers (over the dielectrics intended for insulation) and the source and drain regions of desired thin-oxide transistors. Increasing the source voltage by a small amount increases the field threshold voltage required on the gate of these parasitic transistors to produce conduction in the channel region formed by the source to levels which are several volts higher than conventional levels.

It is in general good practice to eliminate these currents described in 1) and 2) above, but in any case, the source of high voltage has limited current sourcing capability and unwanted current load can prevent the source from reaching the desired high voltage levels.

There are a total of 40 X-decode circuits (See FIG. 1). Each one connects the four pre-decode lines into the array, thus providing the addressing for 160 rows. Bringing the select gate high connects the addressed row onto the columns for both write and read operations. The X-decode also allows the clear gates to be addressed. For reading and programming all clear gates may be taken to the same voltage. However, for clearing a particular row, then only that row has its clear gate taken high; the others remain at a low voltage (FIG. 6). A practical difficulty is encountered when connecting decode circuits into a memory. Since the memory is an array of cells each consisting of few transistors (in this case two) with attention given to reducing the physical size of these transistors, it is difficult to perform the physical layout of the decode circuits which interface to the array such that they "fit" into the same pitch. In the case of the column drivers, it is done by multiplexing a column driver with eight columns, therefore there is an available width equal to the width of eight columns. In the case of the X-decode, it is done by use of a pre-decode and by positioning the driving circuits for the clear gates on the opposite side of the array. Thus, only the select gates are connected into the X-decode and the select gate is then used as the input to the clear gate driver.

The purpose of the clear gate driver circuit is to apply 0 V to all clear gates during program, to connect the select gate to the clear gate during clear, connect 4 V to the selected clear gate during read and connect 0 V to the unselected gates during read. The advantage in taking only the selected clear gate to 4 V instead of the whole array is the reduced load that is applied to the circuit which generates the 4 V supply, especially since it must settle to an accurate voltage in a short time interval.

Figure 9:
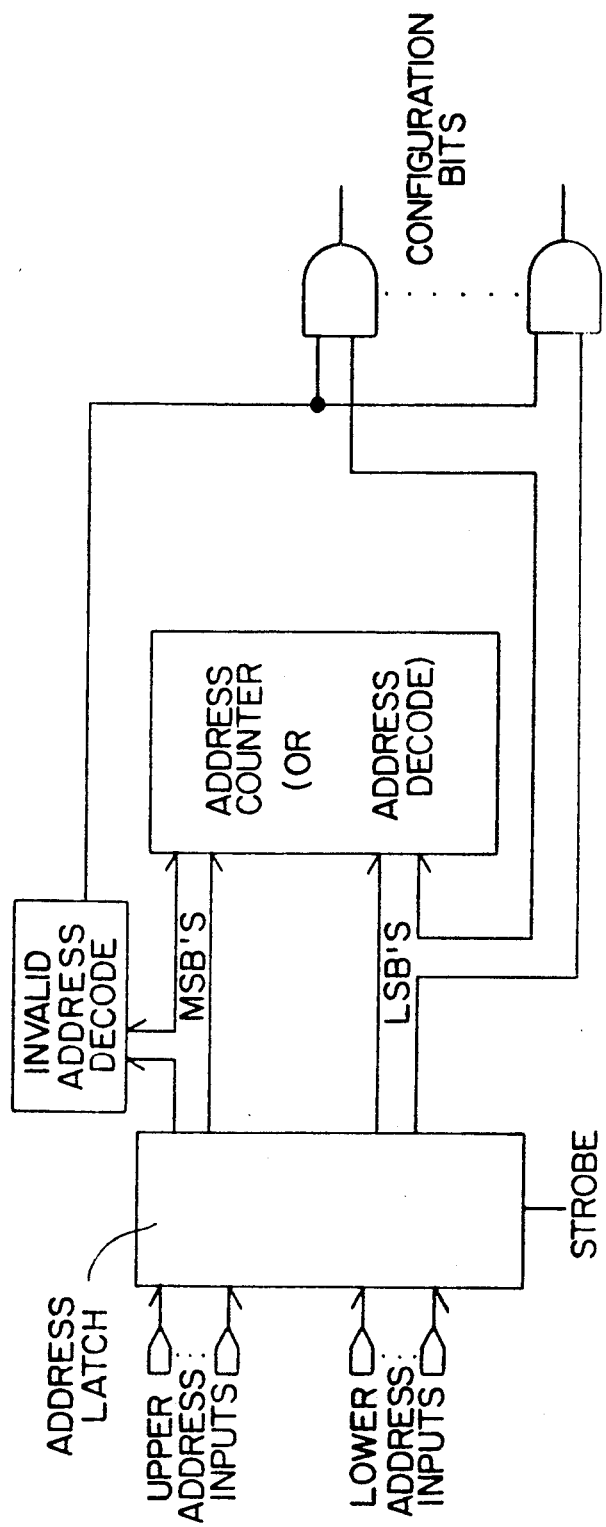
FIG. 9 is a block diagram for the circuit for detecting invalid addresses and the use of the same to control configuration bits for the integrated circuit system.
Figure 10:
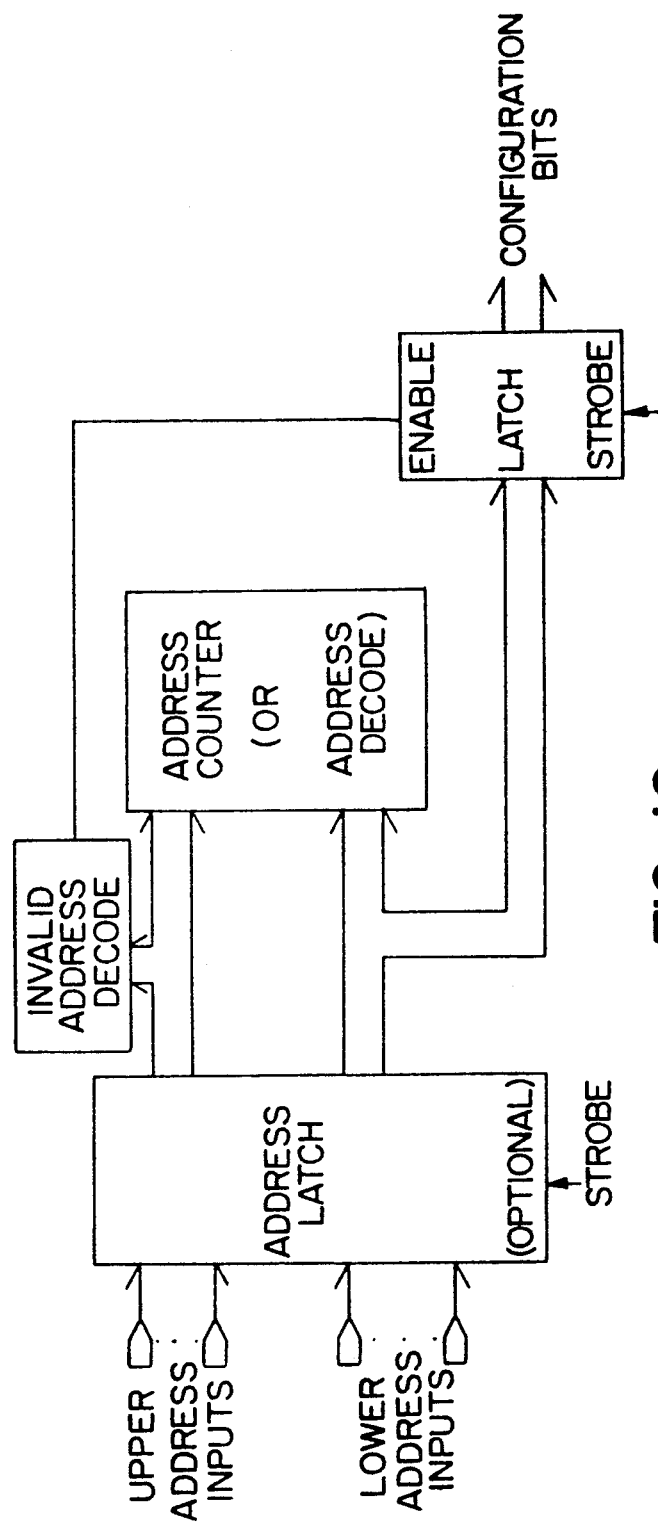
FIG. 10 illustrates a variation of FIG. 9 showing the addition of a latch to store the value of the configuration bits.

The address inputs A0 through A7 have an addressing capacity of 256. Since the total number of rows, however, is only 160, the spare capacity can be put to another use. The control input pins (PD, $\overline{CE}$, and P/$\overline{R}$) perform specific control functions. However, different applications might prefer different behavior from the input or the output pins. The unused address capacity allows us to modify the function of the pins and therefore satisfy the needs of different applications with the same design. The higher order address bits are examined to establish whether or not the address is invalid. In the case of the preferred embodiment, if the address is greater than 159 it may be considered invalid and the lower order bits are then used to indicate that different control options are to be selected. In fact only the most significant two bits A6 and A7 are examined in the preferred embodiment. If they are both at logic "1"—corresponding to the range 192 to 255—then the lower order bits A0 through A5 are used to select control options. FIG. 9 shows the arrangement used in the preferred embodiment. The configuration bits are forced to their default state during valid addresses. For an invalid address the configuration bits are determined by the address inputs. FIG. 10 is a variation showing the addition of a latch to store the value of the configuration bits. The advantage here is that the configuration bits can be stored and then used at a later time for operations using valid addresses. In either case, additional flexibility is added to the device without the addition of extra control pins.

The address pins are also used to define test modes. To enter a test mode, a voltage higher than the voltages which the device would encounter in normal operating conditions, is applied to one of the device input pins (in the case of the preferred embodiment, the A7 pin, FIG. 1). A high voltage detector circuit is connected to this input pin to detect the presence of a high voltage and produce a signal which enables the selected test mode(s). The remaining address pins A6 through A0 are used to define the selected test modes. The purpose of the test modes is twofold—to reduce the length of time that is required to test the device and secondly to allow access to internal circuit nodes which are not otherwise directly accessible. In the first category are the test modes which cause a particular pattern to be written into the array in a reduced number of operations. This is done by enabling groups of rows and/or columns simultaneously—for example the outputs of the row counter together with their inverse signals are forced to states which select either all rows simultaneously or even numbered rows or odd numbered rows. Similarly the column counter outputs and their inverse can also be forced such that all columns or even columns or odd columns are connected into the column driver simultaneously. Since the address input states defining the condition of the column counter is independent from the states defining the condition of the row counter, the test modes for each can be selected in any combination, e.g. odd rows with even columns and visa versa. These modes allow alternating patterns such as horizontal stripes, vertical stripes, and checkerboards to be written into the complete array in a much reduced time period.

The actual voltage stored in the array depends on the analog value which has been loaded into the sample and hold capacitors. In addition there are modes which inhibit the high voltage pulses reaching the array during either the clear or program cycles. In these modes all rows are selected, so the array is completely erased or completely programmed—mass erase and mass program. Such test modes allow a pattern to be loaded quickly into the array. There is also provision for reading the stored pattern at increased speeds. The sample rate during playback is increased by two possible methods—either apply high speed clocks to the external clock input to increase the basic timebase frequency, and/or enter a test mode which by-passes some of the stages of the dividing chain which creates the sample frequency. In either case, the filter is removed from the playback signal path by connecting the output of the differencing amplifier into the power amplifier. This is necessary since the filter would bandlimit at a frequency which is less than the output data rate. A test mode is also provided for connection of the filter input and output to device pins, thus allowing for more direct tests of the filter characteristics. Access to the internal nodes VCCA and CHV is provided by high voltage switches which connect either these nodes to a device pin (P/$\overline{R}$) on selection of the appropriate test mode. To facilitate the measurement of actual stored voltages and their variation, a test mode causes the DIFREF input into the differencing amplifier to be forced to VAGND.

The input logic receives input from the input pads PD, $\overline{CE}$ and P/$\overline{R}$. These are acronyms for power down, CHIP ENABLE, and PLAYBACK/$\overline{RECORD}$. Inputs are also received from internal signals—power-on-reset (POR), configuration bits, LOVCC (a signal which becomes active when VCC is below a certain level), the EOM column outputs, and a switch debounce clock from the column multiplex counter. Control signals from the input logic are distributed to various parts of the IC to control power down, the enable and reset of various blocks, the writing of EOM markers, the latching of address inputs and the selection of record and playback modes. The configuration bits select options between various control options; whether $\overline{CE}$ is edge sensitive or level sensitive; whether the row counter is reset at the beginning of each operation or only when changing from record to playback or playback to record; whether playback stops or continues when the signal from the EOM column becomes active; whether the $\overline{EOM}$ output pad pulses low at EOM and overflow of the address counter or only at overflow of the address counter; whether the EOM markers are retained or deleted by the next message; and whether the playback speed is normal or at an accelerated rate. These various operation modes can be selected in any combination as described earlier, depending on the state of the address pins. The accelerated playback rate (or fast forward mode) can be used by the external controller to locate the positions or addresses of an end of message. In this mode the modulus of the dividing chain is reduced by bypassing some of the stages—in the case of the preferred embodiment the column register is bypassed and an acceleration factor of 100× is achieved. The audio output is disabled but the EOM markers still produce a pulse at the $\overline{EOM}$ output pad. The device is put into the fast forward and the controller measures the time or records the number of external clock pulses at which the $\overline{EOM}$ outputs appear. The addresses of the next locations would be the start addresses of the subsequent messages and can be calculated from the time or the clock count. This address can then be input to the address pins, the address counter preset to this value and the playback begun from this point. Alternately the controller may use the fast forward mode to quickly move to the end of a particular message and then, without changing the address counter, begin a normal playback of the next message. Since the audio output is disabled during fast forward, the audio output begins at the start of this next message. In this way the controller is not required to have a record of the array locations or addresses corresponding to the beginning or the end of the messages. Instead, all that is required to be known is the order in which the messages appear and for the recordings to be continuous without any spurious or residual EOM markers. This is achieved by recording the messages in a continuous manner or by careful management of addressing during recording. The device is configured into the fast forward mode (resetting the address counter) and as the $\overline{EOM}$ pulses appear they are counted by the controller. When the $\overline{EOM}$ pulse belonging to the message previous to the desired message is encountered the chip is disabled and then put into the normal playback mode without resetting the address counter. The desired message is then played back. The arrangement is particularly effective if the fast forward acceleration is high so that the delay between initiating the search and the beginning of playback is short.

The input logic also allows the device to be disabled, by bringing $\overline{CE}$ high, and enabling the device again without loss of the contents of the address counter. During playback this would be similar to the "Pause" feature found on other types of record instruments.

During power down mode i.e. PD pin high, all possible steps are taken to reduce power consumption, including turning off the DC current bias sources for the analog section. On power up, however, there is a finite time required for the analog voltages and references to settle. In particular the connections to external pins (e.g. MICIN and AGC) have relatively large capacitances to drive and require a fairly long settling time. It is desirable to have these voltages settle before making a recording. After bringing PD low and coming out of power down, the device uses the timebase and dividing chain to provide a settling period (25 milliseconds) before allowing the device to respond to a $\overline{CE}$ input.

Figure 11:
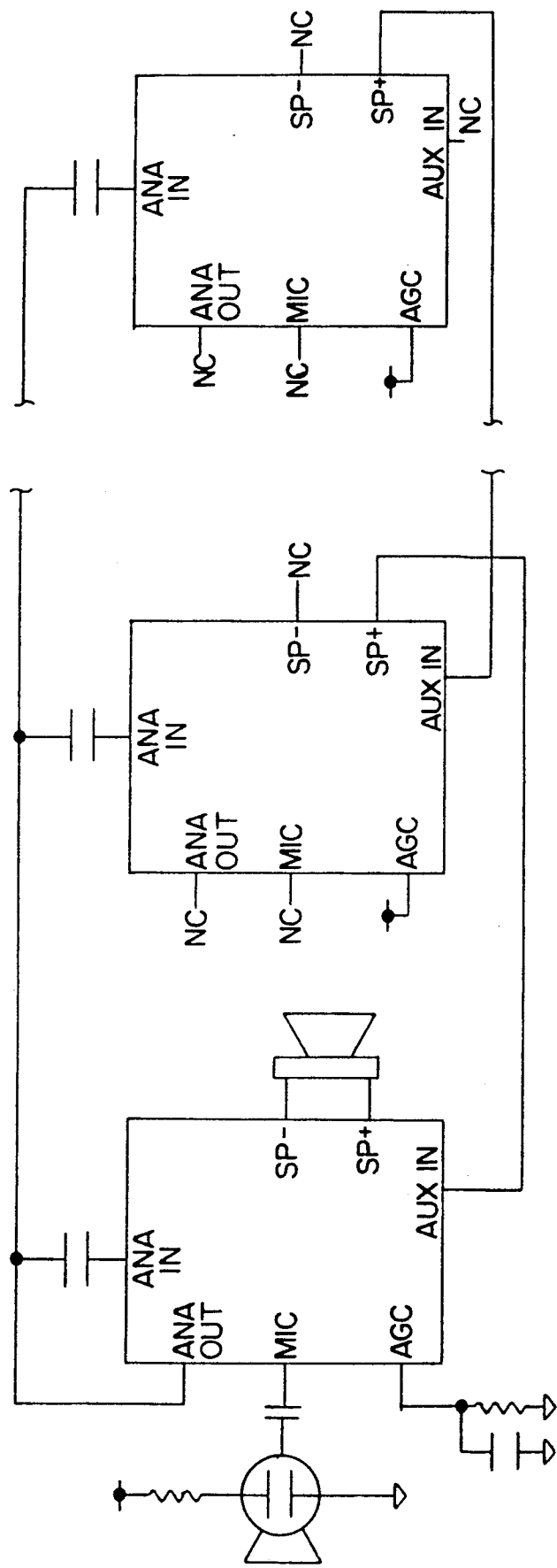
FIG. 11 shows the analog connections for connecting several devices to a single microphone, AGC resistor and capacitor, and loudspeaker for cascading multiple devices to extend the record and/or playback time in a simple and efficient manner.

The input logic and the analog circuits allow more than one device to be connected (or cascaded) together in order to extend the record duration. FIG. 11 shows the analog connections for connecting several devices to a single microphone, AGC resistor and capacitor, and loudspeaker. The ANAOUT of one device is capacitively coupled to each of the other devices, as well as to itself. The number of devices that can be driven by a single pre-amplifier output depends on the drive capability of the circuits driving the ANAOUT pin. If additional drive capability is required then an external analog buffer can be connected between the ANAOUT pin and the coupling capacitors. The loudspeaker, unlike the microphone, must be connected to the first device in the chain. All devices are powered up together, but only one device is active at any one time. The $\overline{EOM}$ output is connected to the $\overline{CE}$ of the next successive device in the chain such that, as one device reaches its capacity and the address counter reaches the maximum valid address, the $\overline{EOM}$ pad goes low to select the next device. During playback, to maintain the pause feature without changing the device which is active, once a device has reached capacity it must continue to produce a low level on $\overline{\text{EOM}}$. With such a connection scheme the $\overline{\text{EOM}}$ pulses due to end of message markers must be inhibited, as otherwise they will be interpreted by the next device as an enable command. This is available on the device as one of the configuration modes. Another event which occurs as the device reaches capacity during playback takes place at the power amplifier multiplexer. As well as taking $\overline{\text{EOM}}$ low, the multiplexer is switched from the internal source to the external pin. The gain of the power amplifier from AUXIN to SP+ is unity, so the output from the active device is passed through each previous device in the chain until it reaches the first device, which drives the loudspeaker. The AUXIN input to the power amplifier is also selected when the device is deselected due to a high level on $\overline{\text{CE}}$. This allows the use of the power amplifier by other parts of a system which doesn't necessarily use cascading.

The high voltage generation is performed by on-chip circuits—there is no need to provide external sources or perform external regulation or waveshaping. A high speed oscillator is buffered to produce two-phase pulse sources before being input to the voltage multiplying charge pumps—CHARGE PUMP, MHV and VDBL. There are no special steps taken to make the phases non-overlapping; however, for optimum operation, the time duration which the two phases spend at opposite voltages is maximized. During time periods in which the sensitive analog operations are performed e.g. during sample and compare periods, the high speed oscillator is disabled to minimize the amount of noise coupled onto the sensitive nodes. The charge pump which creates the signal CHV is the one used for writing into the array. There is no attempt made to control CHV at the pump itself; the control is done by two shunt elements—the RAMP LIMIT circuit and HV INC. Both of these shunt circuits operate on the principle of voltage regulation by controlling a shunt current to the negative supply (VSS). The MHV pump creates a voltage of about 12 V to assist in eliminating gated diode breakdown of high voltage nodes. It is also used in the read path to reduce the impedance of transistors which cannot be made physically large due to layout constraints. For instance the column multiplex transistors and the select gates should be a low resistance to minimize unwanted voltage drops in the voltage follower path. The VDBL voltage is required in the MOSFET-R control circuit to extend the range of the control voltage.

It is known that higher tunnel currents reduce the endurance of the tunnel oxide (the number of times that the voltage level on the floating gate can be changed from erased levels to programmed levels and visa versa). With increasing number of erase/program cycles the difference in threshold voltage between erase and program states appears to reduce—a particular problem for digital memories that apply predetermined program pulses and compare cell characteristics against a fixed reference. This is thought to be due to electron trapping in the tunnel oxide which creates opposition to the field creating the tunnel current. Moreover, it is thought that higher tunnel current increases the likelihood of blowout of the tunnel oxide. It is therefore desirable to reduce the tunnel currents to a minimum. This is done by reducing the rate of change of voltage across the tunnel oxide i.e. reducing the ramp rate of CHV.

The conflict, however, is that it is also desirable to include as many high voltage pulses as possible in the program cycle in order to improve storage resolution—this would imply a fast ramp rate for CHV. The purpose of the RAMP LIMIT circuit is to help resolve this conflict. During the clear pulse, the addressed cells are being taken from a programmed condition to an erased condition. Tunnel current is likely to be high because of the relatively large change in floating gate voltage and large voltage difference across the tunnel oxide. It is therefore important in this case to limit CHV to a slow ramp rate—this allows the floating gate voltage to "track" the slowly increasing clear gate voltage with a smaller tunnel current. During the coarse program cycle, however, the cell undergoes incremental changes in programming voltage. The corresponding increment on the floating gate is small and the tunnel current is also small. In the case of the coarse program cycle, then, since the tunnel current is limited by the small increments of the peak voltage of CHV, there is no need to limit the ramp rate. The ramp can be made quite steep, thus allowing the CHV pulse width to be reduced and consequently increase the number of pulses that can be included in the coarse cycle. Similarly the fine cycle has even smaller increments of high voltage applied to the cell and by the same argument the ramp rate can be higher and the pulse width smaller.

The purpose of the RAMP LIMIT circuit is to provide a variable ramp rate, depending on the present control mode (clear, coarse or fine)—pulse width control is performed by the timing circuits. The concept of a ramp limiter and the circuit to realize it has been used in digital EEPROMS by others. However, the improvement here is the variable slope and also the use of current references from the analog bias generator.

Figure 12:
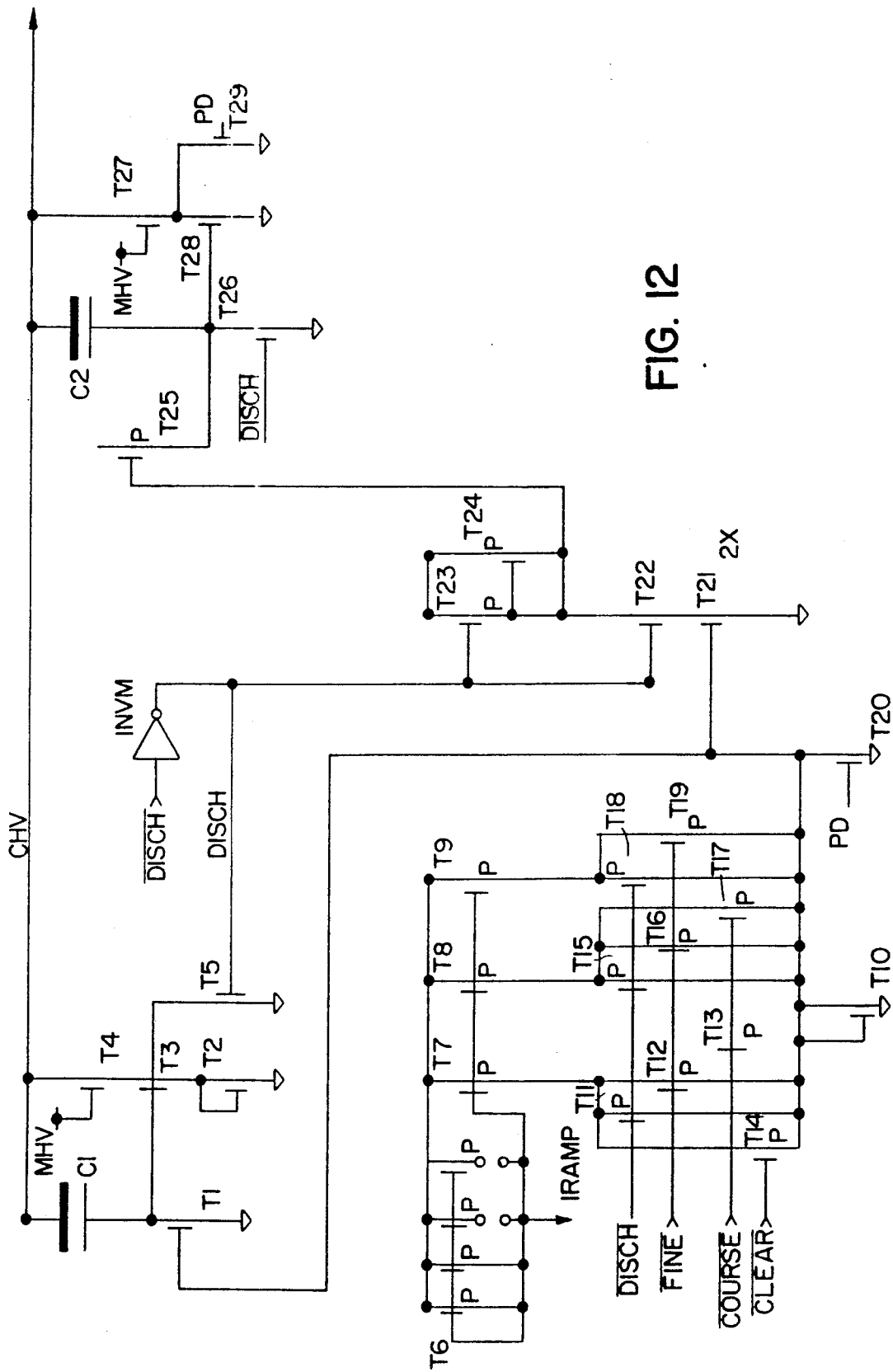
FIG. 12 is a circuit diagram for the high voltage ramp up and ramp down circuit used in the preferred embodiment.

The ramp rate is determined by the current flowing in T1 (See FIG. 12). As CHV rises, so the capacitor C1 couples a current, onto the drain of T1. If this current is greater than the T1 drain current, then the voltage on T1 drain increases. T3 turns on and shunts current from CHV through T4, T3, and T2 to VSS. Since the CHV voltage has a limited source current (it actually has a high equivalent internal resistance of the order of tens or hundreds of kilohms for practical charge pumps and pulse sources) the voltage increase begins to slow down. This reduces the current through C1, the voltage on the gate of T3 reduces and CHV ramp rate increases. The circuit actually stabilizes so that the current through C1 is equal to the current through T1. The purpose of T4 is to limit the drain voltage on T3 so that a gated diode breakdown path does not occur (this would limit the maximum voltage attainable by CHV). T4 does not create a gated diode path since its gate is at MHV, which in turn is maintained at about 12V. The purpose of T2 is to increase the voltage which CHV reaches before the T3 turns on and the limit action begins.

The improvements are incorporated in transistors T6 through T20. A current reference IRAMP is received from the current bias generator and mirrored into transistors T7, T8 and T9. Transistor dimensions are all equal so that electrical characteristics are matched, but the number of component structures incorporated in each transistor is ratioed to provide a ratio of currents. Thus the current available from T7, T8, and T9 depends on the number of individual components making up each transistor. Transistors T11 through T19 are switching transistors that enable or disable the available current from T7 through T9 to flow into T10. Thus the current flowing into the drain of T10 depends on the state of the signals $\overline{\text{DISCH}}$, $\overline{\text{FINE}}$, $\overline{\text{COURSE}}$, $\overline{\text{CLEAR}}$. The preferred implementation produces the current ratio 10:10:5:1 for $\overline{\text{DISCH}}$:$\overline{\text{FINE}}$:$\overline{\text{COURSE}}$:$\overline{\text{CLEAR}}$. The current through T10 is mirrored onto T1 and therefore controls the positive going ramp rate of CHV. The current mirrors could be implemented in n-channel transistors referenced to VSS, with switches implemented in n-channel transistors or n and p-channel transistors. Also the control signals may not necessarily be dedicated to a particular mode—it is possible for a coded set of input signals to be applied. In other words the general description would be a set of ratioed current sources with a means to selectively direct each of these currents into one transistor which is then mirrored into the ramp limit circuit.

Another section of the RAMP LIMIT circuit consists of T21 through T29 and C2. This section controls the rate at which CHV ramps down. It is desirable to control the ramp down rate so that the disturbance created by discharging the large capacitance connected to CHV is reduced. However, the node must be discharged fairly quickly (about 2 μ secs), in keeping with the need for a large number of CHV pulses. The discharge transistors T27 and T28 must therefore have a high current sink capability but nevertheless must not be allowed to operate in an uncontrolled fashion. The ramp down circuit operates in a similar fashion to the ramp up circuit. When the circuit is controlling, the current through C2 is equal to the current through T25. The signal $\overline{\text{DISCH}}$ goes to a low level, allowing the gate of T28 to rise and thus discharge CHV. As CHV falls, the coupling through C2 maintains a gate voltage on T28 and a discharge rate of CHV such that the current through C2 is equal to the current through T25.

Figure 13:
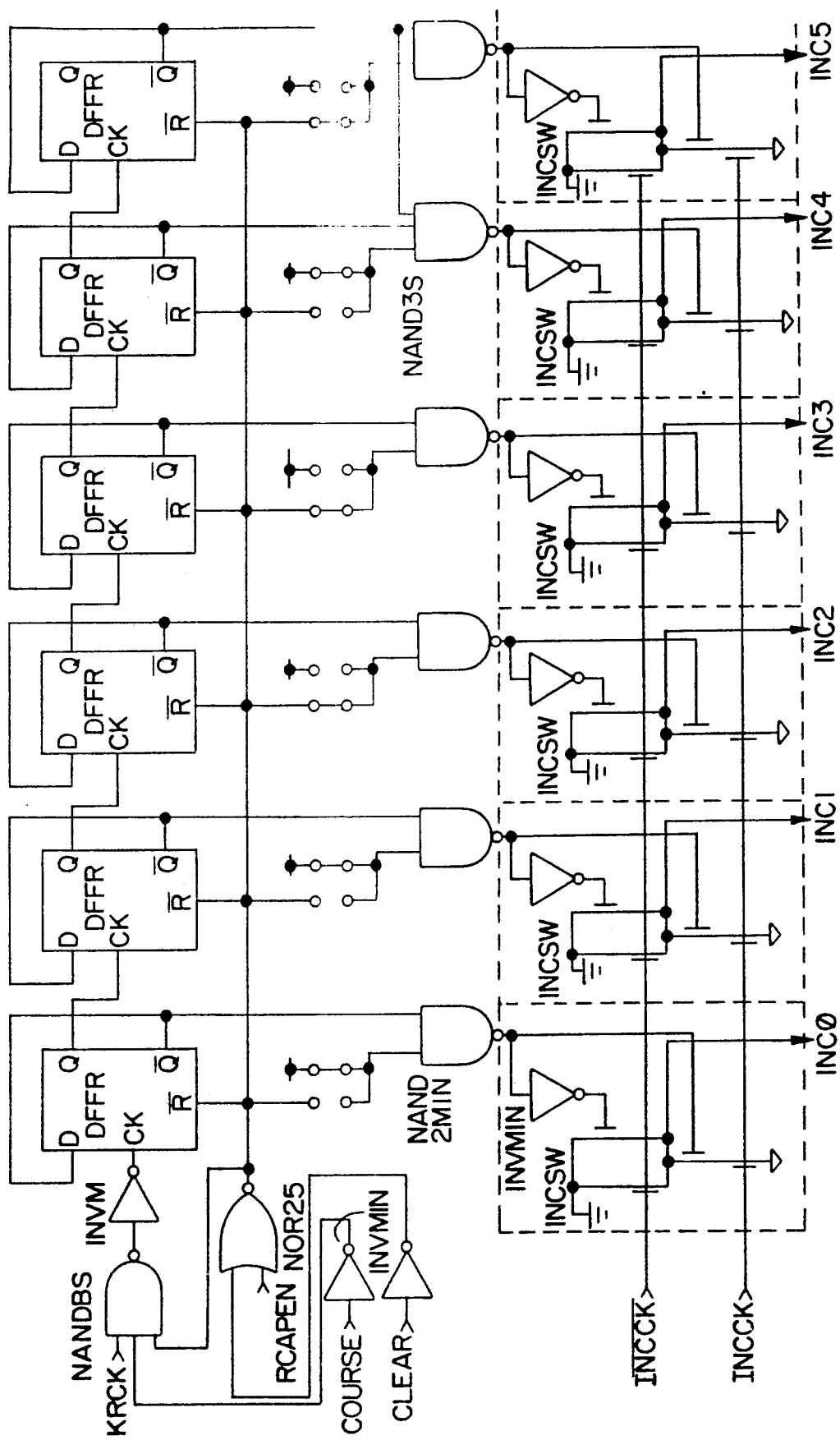
FIG. 13 is a circuit diagram of a binary counter and analog switches of a high voltage increment circuit called the HV INC circuit.
Figure 14:
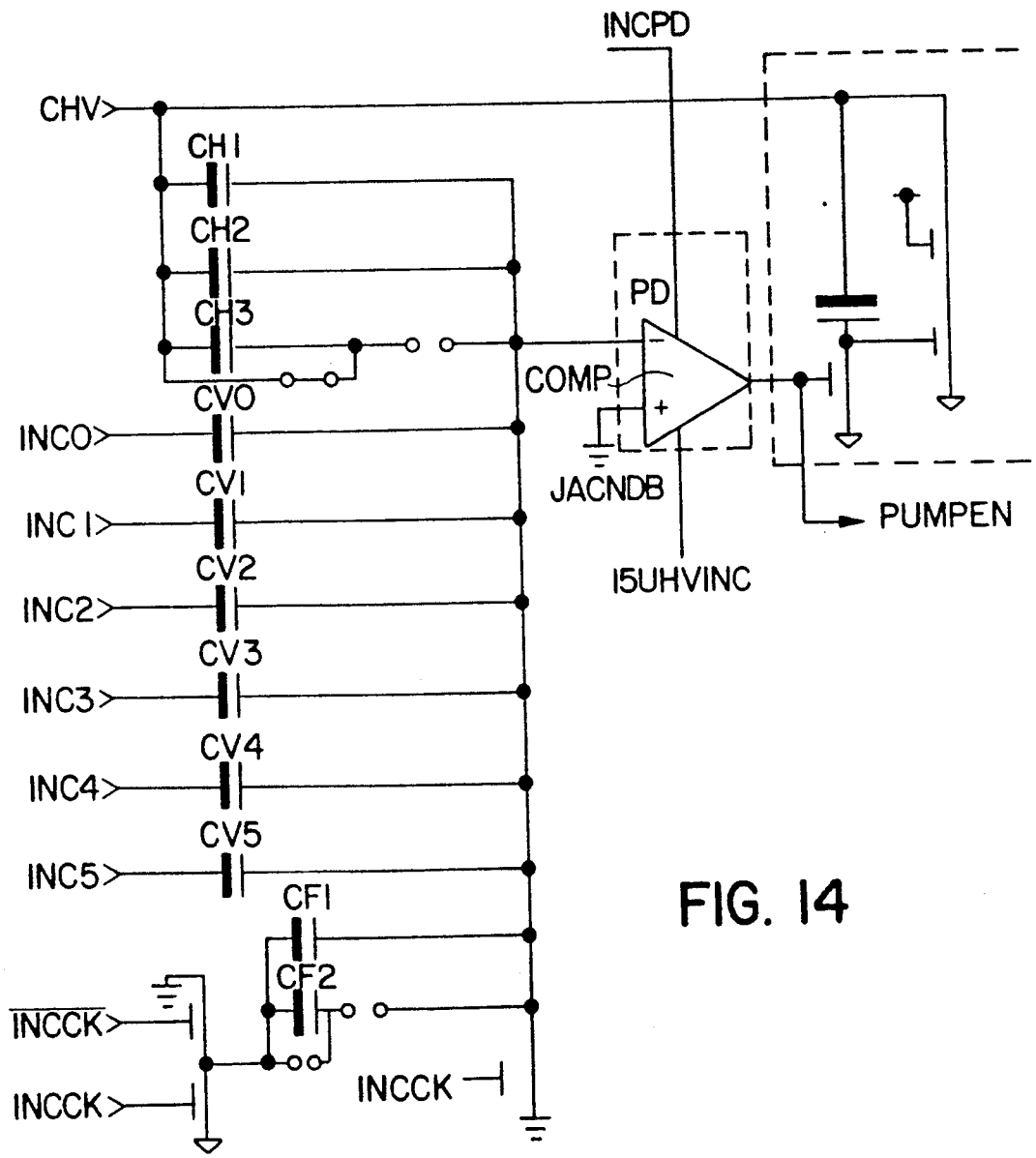
FIG. 14 is a circuit diagram of the capacitors and comparator of a high voltage increment circuit called the HV INC circuit.

The writing algorithm requires a high voltage which is incremented during each coarse pulse, and be at a fixed level during the clear and fine cycles. This function is performed by the HV INC circuit. It consists of a binary counter and analog switches shown in FIG. 13 and capacitors and comparator in FIG. 14.

During the clear cycle, the signal $\overline{\text{CLEAR}}$ is low. This resets the six-bit counter, setting all the $\overline{\text{Q}}$ outputs high. The outputs of the nand gates at this time depend on the positions of switches SW0 through SW5—these are metal options that are set during manufacturing and cannot be changed afterwards. The signal INCCK changes state from low to high (as it does at the beginning of each high voltage pulse)—$\overline{\text{INCCK}}$ is the inverse signal and is non-overlapping with INCCK. Thus the signals INC0 through INC5 change from VAGND (1.5 V) to VSS depending on the output of the nand gates—if the nand gate output is high then the INC output switches from VAGND to VSS; if the nand gate output is low then the INC output remains at VAGND. The INC signals are applied to capacitors CV0 through CV5 of FIG. 14, the input to capacitor CF is switched from VAGND to VSS, the inverting input to the comparator which had previously been charged to VAGND is released, and since CHV is not changing at this time, there is a resultant negative voltage transition on the inverting input to the comparator and consequently its output PUMPEN goes high. CHV, which had previously been held at VSS, is now allowed to rise (under control of the RAMP LIMIT circuit). This couples a positive-going voltage into the inverting input of the comparator. The amount of charge coupled is equal to the product of CHV and the capacitor CH. CHV continues to rise until the positive charge coupled onto the comparator is equal to the negative charge coupled through the CV capacitors and CF. At this time the comparator output PUMPEN goes low and inhibits further increase of CHV. This can be done by either inhibiting the pump or by a voltage clamp circuit. In the former case, any drop in CHV voltage (due to leakage for instance) will cause PUMPEN to go high, enable the pump and return CHV to the previous level which caused the comparator to switch. Hence CHV voltage is held at a level determined by the initial charge coupled into the comparator when INCCK first went high. Loss of charge due to leakage or other causes must be small relative to the capacitively coupled charge for steady regulation of CHV—which is the case for the fairly short time periods involved (a few milliseconds maximum). At the end of a high voltage pulse, the pump is disabled, CHV is ramped down and INCCK is taken low ready for the next pulse.

The minimum level of CHV occurs when all the inputs to the CV capacitors remain at VAGND i.e. when all the counter bits are reset, the $\overline{\text{RESET}}$ signal is high and all the nand outputs are low as occurs at the beginning of the coarse cycle. CHV voltage at this time is determined by the ratio of CF and CH and the value of VAGND. The counter is incremented before each high voltage pulse in the coarse cycle and a negative going pulse is applied to the CV capacitor if the corresponding bit of the counter is set. The values of the CV capacitors are weighted to give the desired increments to CHV. During the fine cycle, the counter does not receive any clock pulses and the counter value remains at the maximum count attained at the end of the coarse cycle. At the beginning of each coarse cycle the counter is reset.

The voltage reference VAGND is derived from a bandgap reference and is therefore extremely stable with VCC and temperature and is unaffected by age and the number of write cycles. Absolute voltage accuracy is adequate, but can be made more precise if necessary by use of the trim bits.

Because of the analog reference system used in the present invention, the invention is further useful for implementing a digital memory integrated circuit where the implementation of the digital memory is such that the digital information is encoded as analog information such as voltage levels to be stored in the nonvolatile cells of the analog memory array. Such encoding can be done off the memory chip by a digital to analog converter, or the chip could be modified to provide such encoding on the memory chip. The digital information is recovered from the analog storage array by presenting the analog levels from the nonvolatile analog storage array to an analog to digital converter and outputting the digital information such as a nibble or byte or other combination of digital information. As is the case with the digital to analog converter, the analog to digital converter also may or may not be fabricated on the same integrated circuit as the nonvolatile analog memory array and analog recording apparatus.

While the preferred embodiment of the present invention has been disclosed and described herein in detail, it will be obvious to those skilled in the art that various changes in form and detail may be made therein without departing from the spirit and scope thereof.

We claim:

1. A nonvolatile integrated circuit storage device having the capability of receiving, repetitively sampling, storing and reproducing an analog input signal comprising:

an array of floating gate storage cells, each for storing an analog sample of an input signal;

an input amplifier means coupled to an integrated circuit input terminal for receiving an input signal;

a plurality of sample and hold circuits, each coupled for sampling and temporarily holding a sample of the signal from said input amplifier means;

write means coupled to said plurality of sample and hold circuits and said array of floating gate storage cells for storing in a number of said floating gate storage cells, signal samples held in the plurality of sample and hold circuits, wherein during write operations, the input signal is sequentially sampled and held in a predetermined plurality of sample and hold circuits, and then the plurality of input signal samples being held are stored in an equal plurality of storage cells while additional samples of the input signal are sequentially taken and held;

read means coupled to said array of floating gate storage cells for sequentially reading from a number of said floating gate storage cells the analog samples stored therein;

an output amplifier means coupled to an integrated circuit output terminal for providing an output signal thereto;

row and column address means coupled to the array of floating gate storage cells for addressing specific cells within said array of floating gate storage cells during read and write operations;

address counter means coupled to the row and column address means for addressing the array of floating gate storage cells in logical sequences during read and write operations;

reference voltage means for providing a reference voltage;

reference storage cells also forming part of the array of floating gate storage cells, each for storing an analog sample of the reference voltage;

sample and hold circuits associated with said reference storage cells;

means for causing the reference voltage to be sampled and held when a first and a last of the predetermined plurality of input signal samples are taken;

means for causing the reference voltage samples to be stored in reference storage cells when the respective plurality of input signal samples being held are stored in the respective storage cells.

means for causing the samples of the reference voltage as stored in respective reference storage cells to be read from reference storage cells when a signal sample stored in any signal storage cell of the respective analog signal sample storage cells of the array is read out of the array;

means for providing a storage cell reference voltage by combining the reference voltages read from the reference storage cells with a relative weighting dependent upon the relative time the respective signal sample was taken and held in comparison to the times the respective reference voltage samples were taken and held, to provide a cell reference voltage; and means for taking the difference between the signal sample read out of a storage cell of the array and the respective cell reference voltage.

2. The nonvolatile integrated circuit storage device of claim 1 wherein said sample and hold circuits are closed loop sample and hold circuits wherein the difference between the voltage on a holding capacitor and the signal being sampled is amplified and used to charge the holding capacitor to minimize the difference between the voltage on said holding capacitor and the signal being sampled.

3. The integrated circuit storage device of claim 1 wherein:

the array of floating gate storage cells is arranged in columns and rows;

the reference floating gate storage cells are arranged in columns at the sides of the last named array;

and further comprised of:

floating gate storage cells used for indicating end of massage arranged in columns at the sides of the reference floating gate storage cells; and, means responsive to an end of message signal applied to the integrated circuit storage device to cause the integrated circuit storage device to stop a read operation or provide a signal to indicate that an end of message signal has been encountered.

4. The integrated circuit storage device of claim 1 wherein:

the address means is also responsive to externally applied addressing signals.

5. The integrated circuit storage device of claim 4 further comprising:

means for setting test modes within the integrated circuit storage device.

6. The integrated circuit storage device of claim 4 further comprising means responsive to test mode settings for mass programming of the array of signal sample storage cells in any of a plurality of test patterns.

7. The integrated circuit storage device of claim 6 further comprised of means for writing the test patterns in a reduced time period using multiple selection of rows and columns of the array.

8. The integrated circuit storage device of claim 7 wherein one of the plurality of test patterns is at least one alternating pattern of voltages.

9. The integrated circuit storage device of claim 8 wherein the plurality of test patterns includes horizontal stripe, vertical stripe, and checkerboard patterns.

10. The integrated circuit storage device of claim 4 wherein:

the address range of the externally applied addressing signals exceed the range of addresses of the analog signal sample storage cells in the array;

and further comprising:

means setting configuration modes within the integrated circuit storage device.

11. The integrated circuit storage device of claim 4 wherein:

the address range of the externally applied addressing signals exceeds the range of addresses of the analog signal sample storage cells in the array;

and further comprising;

additional storage cells addressable by externally applied addressing signals outside the range of addresses of the analog signal sample storage cells in the array for storing digital information.

12. The integrated circuit storage device of claim 11 further comprising:

means coupled to some of the additional storage cells for trimming the frequency of the oscillator of the integrated circuit storage device.

13. The integrated circuit storage device of claim 12 wherein the additional storage cells form an extension of the array of floating gate storage cells, whereby the write means for the array of floating gate storage cells may be used also by the additional storage cells when storing digital information therein.

14. The integrated circuit storage device of claim 11 wherein at least some of the additional storage cells are used in pairs with differential logic level programming to store trim bits for the nonvolatile integrated circuit storage device, each such pair of additional storage cells being coupled to a differential sense amplifier with input weighting to force the differential sense amplifier output to a default level when the trim cells are in their native unprogrammed condition, each such pair of additional storage cells being programmable to force the differential sense amplifier output to a level opposite to the default level when the trim cells are in their native unprogrammed condition.

15. The integrated circuit storage device of claim 14 further comprising:
means coupled to some of the additional storage cells for trimming the frequency of the oscillator of the integrated circuit storage device;
means coupled to some of the additional storage cells for trimming the frequency response of the filter of the integrated circuit storage device, the oscillator and filter having a frequency and frequency response respectively which are trimmable in unison responsive to a trim current; and,
a bandgap reference means for providing a trim current to the oscillator and to the filter.

16. The integrated circuit storage device of claim 11 further comprising:
means coupled to some of the additional storage cells for trimming the frequency response of said filter of the integrated circuit storage device.

17. The integrated circuit storage device of claim 1 wherein the write means stores the signal samples held in the plurality of sample and hold circuits in said storage cells by repetitively pulsing each cell with a voltage pulse followed by reading the voltage so stored in the cell and comparing the same with the value held in the respective sample and hold circuit until the desired comparison is reached, successive voltage pulses being of increasing amplitude, the integrated circuit storage device further comprising circuit means for providing successive voltage pulse ramps of more than one pulse width to program the cells.

18. The integrated circuit storage device of claim 17 wherein a successive voltage pulse ramp is comprised of pulses of a pulse width less than the preceding voltage pulse ramp.

19. The integrated circuit storage device of claim 18 wherein the starting voltage of a successive pulse train is dependent upon the voltage of the pulse of the prior pulse train for which the desired comparison between the voltage stored in the cell and the value held in the respective sample and hold circuit was obtained.

20. The integrated circuit storage device of claim 1 further comprising a filter coupled to the input amplifier means during write operations.

21. The integrated circuit storage device of claim 20 further comprising means for coupling the filter between said read means and said output amplifier means during read operations for providing smoothing for the output signal during read operations.

22. The integrated circuit storage device of claim 21 further comprised of means responsive to control signals to decouple the filter from between said read means and said output amplifier means during read operations to allow testing of the nonvolatile integrated circuit storage device at a substantially increased speed.

23. The nonvolatile integrated circuit storage device of claim 20 further comprised of means for selectively decoupling the filter from between the input amplifier means and the write means during write operations, whereby write operations may be executed at substantially accelerated clock rates.

24. The integrated circuit storage device of claim 1 further comprising:
fast forward means to accelerate the addressing of the array of storage cells to locate the position or address of an end of message signal or to reach a position quickly without using a start address.

25. The integrated circuit storage device of claim 1 wherein the input amplifier means includes an automatic gain control means for maintaining the input amplifier means output signal range within predetermined limits.

26. The integrated circuit storage device of claim 25 wherein the attack and release times for the automatic gain control means are both settable by a single external resistor and capacitor.

27. The integrated circuit storage device of claim 1 wherein the input amplifier means includes an automatic gain control stage and a fixed gain stage, the output of the automatic gain control stage and the input to the fixed gain stage not being connected together in the integrated circuit, but each being coupled to a respective integrated circuit terminal whereby they may be connected together by connecting the last named terminals together, whereby an input signal may be coupled to the integrated circuit through the automatic gain control stage or directly to the fixed gain stage.

28. The nonvolatile integrated circuit storage device of claim 1 wherein said output amplifier means provides a double ended amplifier output signal.

29. The nonvolatile integrated circuit storage device of claim 1 wherein the oscillator and filter have tracking frequency characteristics dependent on the resistance of a plurality of MOSFETs, and further comprising a high voltage supply on the integrated circuit for providing a voltage within the integrated circuit substantially above a power input voltage to the integrated circuit to control the voltage on the gates of the plurality of MOSFETs, thereby providing a wider gate control range to allow for process, temperature and power supply changes than would be provided by the lower power input voltage.

30. The nonvolatile integrated circuit storage device of claim 29 wherein the plurality of MOSFETs are low threshold MOSFETs.

31. The nonvolatile integrated circuit storage device of claim 1 further comprised of a high voltage reference on the integrated circuit coupled to a power input terminal of the integrated circuit to operate circuits thereon at voltages above the voltage on the power input terminal.

32. The nonvolatile integrated circuit storage device of claim 1 further comprised of a regulated voltage reference on the integrated circuit coupled to a power input terminal of the integrated circuit to provide regulated array and clear gate voltages, thereby providing power supply noise rejection therefor.

33. The integrated circuit storage device of claim 1 further comprised of input logic means to power down subsections of the integrated circuit not operational during certain modes of operation of the storage device.

34. The integrated circuit storage device of claim 33 further comprised of means to pull outputs of the output amplifier means to a predetermined voltage during power down to provide a low output impedance for the outputs of the output amplifier means.

35. The integrated circuit storage device of claim 1 further comprised of means for preventing the enabling of the operation of the integrated circuit storage device for a predetermined length of time after applying power to the integrated circuit storage device or after applying a signal which causes the device to leave a power down condition to provide a settling time for circuits therein.

36. The integrated circuit storage device of claim 1 further comprised of means for detecting the presence of an externally imposed frequency and for coupling the timing means to the external frequency in place of the oscillator.

37. The integrated circuit storage device of claim 1 wherein the write means stores the signal samples held in the plurality of sample and hold circuits in said storage cells by repetitively pulsing each cell with a voltage pulse followed by reading the voltage so stored in the cell and comparing the same with the value held in the respective sample and hold circuit until the desired comparison is reached, successive voltage pulses being of increasing amplitude, the integrated circuit storage device further comprising ramp circuit means for providing successive voltage ramps of more than one ramp rate to provide more than one pulse train of successively increasing voltage pulses to program the cells.

38. The integrated circuit storage device of claim 37 wherein the starting voltage of a successive pulse train is dependent upon the voltage of the pulse of the prior pulse train for which the desired comparison between the voltage stored in the cell and the value held in the respective sample and hold circuit was obtained.

39. The integrated circuit storage device of claim 1 further comprising an oscillator and timing means coupled to the oscillator for timing the operation of the sample and hold circuits, the row and column address means, the address counter means and the read and write means.

40. The integrated circuit storage device of claim 1 further comprising encoding means coupled to the input amplifier means for encoding digital information into the analog input signal and decoding means coupled to the output amplifier means for recovering the digital information from the output signal.

41. A plurality of nonvolatile integrated circuit storage devices, each having the capability of receiving, repetitively sampling, storing and reproducing an analog input signal;

each storage device having;
an array of floating gate storage cells, each for storing an analog sample of an input signal;
an input amplifier means coupled to an integrated circuit input terminal for receiving an input signal, said amplifier means including an automatic gain control means for maintaining the input amplifier means output signal range within predetermined limits, the input amplifier means also including a fixed gain stage, the output of the automatic gain control stage and the input to the fixed gain stage not being connected together in the integrated circuit, but each being coupled to a respective integrated circuit terminal whereby they may be connected together by connecting the last named terminals together, whereby an input signal may be coupled to the integrated circuit through the automatic gain control stage or directly to the fixed gain stage;
a filter coupled to the input amplifier means during write operations;
a plurality of sample and hold circuits, each coupled for sampling and temporarily holding a sample of the signal from said filter;
write means coupled to said plurality of sample and hold circuits and said array of floating gate storage cells for storing in a number of said floating gate storage cells, signal samples held in the plurality of sample and hold circuits;
read means coupled to said array of floating gate storage cells for sequentially reading from a number of said floating gate storage cells the analog samples stored therein;
an output amplifier means having its input coupleable to the read means and alternatively to a terminal of the integrated circuit, and the output thereof coupleable to an output terminal of the integrated circuit for providing an output signal thereto;
means for coupling the filter between said read means and said output amplifier means during read operations for providing smoothing for the output signal during read operations;
row and column address means coupled to the array for addressing said floating gate storage cells within said array of floating gate storage cells during read and write operations;
address counter means coupled to the row and column address means for addressing the array of floating gate storage cells in logical sequences during read and write operations;
timing means for timing the operation of the sample and hold circuits, the row and column address means, the address counter means and the read and write means;
the plurality of integrated circuit floating gate storage devices being cascaded together so that during a read operation, each device will enable the read operation of the next device when it reaches the end of its addressable input signal floating gate storage cells, and the output amplifier output of each device is coupled to a prior device in the cascaded combination of devices, whereby the output of each device or all devices so cascaded is available as the output of the output amplifier of the first device of said floating gate storage devices.

* * * * *

UNITED STATES PATENT AND TRADEMARK OFFICE
CERTIFICATE OF CORRECTION

PATENT NO. : 5,241,494
DATED : August 31, 1993
INVENTOR(S) : Blyth et al.

It is certified that error appears in the above-indentified patent and that said Letters Patent is hereby corrected as shown below:

In column 11 at lines 19-20 change
"During the writing of the remaining six scans in the row, the output of the reference column driver is not connected to a column. The reference column drivers is not connected to a column."

to

--During the writing of the remaining six scans in the row, the output of the reference column driver is not connected to a column.--

Signed and Sealed this

Second Day of April, 1996

Attest:

BRUCE LEHMAN

Attesting Officer

Commissioner of Patents and Trademarks